United States Patent
Yu et al.

(10) Patent No.: US 11,349,091 B2
(45) Date of Patent: May 31, 2022

(54) HALIDE PEROVSKITE THIN FILMS AND METHODS FOR PRODUCTION THEREOF

(71) Applicant: FLORIDA STATE UNIVERSITY RESEARCH FOUNDATION, INC., Tallahassee, FL (US)

(72) Inventors: Zhibin Yu, Tallahassee, FL (US); Thomas Geske, Tallahassee, FL (US)

(73) Assignee: THE FLORIDA STATE UNIVERSITY RESEARCH FOUNDATION, INC., Tallahassee, FL (US)

(*) Notice: Subject to any disclaimer, the term of this patent is extended or adjusted under 35 U.S.C. 154(b) by 233 days.

(21) Appl. No.: 16/614,587

(22) PCT Filed: May 18, 2018

(86) PCT No.: PCT/US2018/033302
§ 371 (c)(1),
(2) Date: Nov. 18, 2019

(87) PCT Pub. No.: WO2018/213658
PCT Pub. Date: Nov. 22, 2018

(65) Prior Publication Data
US 2020/0111982 A1 Apr. 9, 2020

Related U.S. Application Data

(60) Provisional application No. 62/508,695, filed on May 19, 2017.

(51) Int. Cl.
H01L 51/42 (2006.01)
C01G 21/00 (2006.01)
H01L 51/00 (2006.01)

(52) U.S. Cl.
CPC ........ H01L 51/4206 (2013.01); C01G 21/006 (2013.01); H01L 51/0003 (2013.01);
(Continued)

(58) Field of Classification Search
CPC ....... C09K 11/06; C09K 11/61; C09K 11/615; C09K 11/0827; H01L 51/4273
See application file for complete search history.

(56) References Cited

U.S. PATENT DOCUMENTS 5,597,411 A * 1/1997 Fritzsche ............ H01L 39/2448
117/937
10,214,833 B1 * 2/2019 Kaehr .................... B33Y 10/00
(Continued)

FOREIGN PATENT DOCUMENTS

WO 2014045021 A1 3/2014
WO 2017060700 A1 4/2017

OTHER PUBLICATIONS

International Search Report and Written Opinion, PCT/US2018/033302, dated Aug. 20, 2018 (11 pp.).

*Primary Examiner* — Khanh T Nguyen
(74) *Attorney, Agent, or Firm* — Eversheds Sutherland (US) LLP

(57) ABSTRACT

Methods are provided for making halide perovskite thin films. The method may include forming a pattern of islands of a nucleation promoter material onto a substrate; applying onto the substrate and islands a solution which includes a halide perovskite or precursors thereof, to form a coated substrate; and drying the coated substrate to form a crystalline halide perovskite film. Halide perovskite thin films, which may be made by these methods, and LEDs including these films are also provided.

23 Claims, 19 Drawing Sheets

(52) U.S. Cl.
CPC ...... *H01L 51/0096* (2013.01); *C01P 2002/34* (2013.01); *C01P 2002/72* (2013.01); *C01P 2004/03* (2013.01)

(56) References Cited

U.S. PATENT DOCUMENTS

2017/0084848 A1 3/2017 Gao et al.
2018/0286596 A1* 10/2018 Snaith ................. H01L 51/4273

* cited by examiner

US 11,349,091 B2

HALIDE PEROVSKITE THIN FILMS AND METHODS FOR PRODUCTION THEREOF

CROSS-REFERENCE TO RELATED APPLICATIONS

This application claims priority to U.S. provisional application No. 62/508,695, filed May 19, 2017, which is incorporated herein by reference in its entirety.

STATEMENT REGARDING FEDERALLY SPONSORED RESEARCH OR DEVELOPMENT

This invention was made with government support under grant number ECCS-1609032 awarded by the National Science Foundation and grant number FA9550-16-1-0124 awarded by the Air Force Office of Scientific Research. The government has certain rights in this invention.

BACKGROUND

In recent years, remarkable optoelectronic properties have been discovered in a group of materials called halide perovskites. However, despite their excellent properties, problems remain that need to be overcome such as short operating lifetimes, and an observed hysteresis behavior in their current-voltage characteristics. Their potential to invigorate the current solar cell and light-emitting diode (LED) industries has been demonstrated by achieving very high device efficiencies in relatively short periods. While higher efficiency records are pursued, an equally important task is to improve their device reliability. To date, most reported perovskite solar cells and LEDs employ a polycrystalline thin film for light absorbing or light emitting purposes. The size of the grains in such films typically vary from sub-100 nanometers to a few micrometers. The high density of grain boundary defects can trap charge carriers and aid the diffusion of water molecules and ionic species in the perovskites, deteriorating their structural integrity and electrical properties in long-term applications.

To alleviate the effect of grain boundaries, a few research groups have explored the fabrication of single crystalline halide perovskite bulk crystals and thin films. For instance, Peng et al. obtained methylammonium lead tribromide ($MAPbBr_3$) single crystals through a cavitation-triggered asymmetric crystallization process. W. Peng et al., *Adv. Mater.* 2016, 28, 3383. The crystals had thicknesses varying from one to tens of micrometers and lateral dimensions from a few hundred micrometers to a few millimeters. Chen et al. introduced a method of confining the crystal growth between two parallel plates. Y.-X. Chen et al., *J. Am. Chem. Soc.* 2016, 138, 16196. The resulting halide perovskite films had thicknesses from tens of nanometers to a few micrometers and lateral sizes up to sub-millimeters.

While these exploratory studies are essential for understanding the fundamental optoelectronic properties of single crystalline halide perovskite thin films, they face challenges of scaling to large lateral dimensions while maintaining a thin film thickness (sub-100 nm to sub-micrometer) that is necessary for high efficiency perovskite solar cells and LEDs. In another approach, Nie et al. used a high-temperature spin coating method and obtained polycrystalline halide perovskite thin films with a maximum grain size of 1-2 mm. W. Nie et al., *Science* 2015, 347, 522. The large grain sizes significantly reduce the density of grain boundaries, and the simple solution process could be potentially scaled up for high throughput industrial production. However, the grain sizes in such films were not uniform, and some grains were as small as a few micrometers. Further, it is likely that the degradation kinetics of the small grains would limit the overall durability of the halide perovskite films and the resulting devices.

Therefore, the need for improved methods of making halide perovskite thin films remains.

SUMMARY

In one aspect, a method of forming a halide perovskite thin film is provided. In some embodiments, the method includes (a) forming a plurality of islands of a nucleation promoter material onto a substrate; (b) applying to the substrate and islands a solution which comprises halide perovskite (or precursors thereof) in solution with a volatile liquid (solvent); and then (c) volatilizing (evaporating) the volatile liquid to form a crystalline halide perovskite thin film. The islands of the nucleation promoter material are discrete regions of the material disposed in selected positions on the substrate in an array, or pattern, such as a grid pattern. The nucleation promoter material may be applied to the substrate by any suitable method for forming the islands, for example by a thermal evaporation process. The nucleation promoter material may be gold, or it may be another metal or a metal oxide. The solution of the halide perovskite can be applied to the substrate by any suitable coating process. For example, the coating process may be spin coating or another suitable coating process known in the art, such as vacuum sputtering, ink jet printing, screen printing, or electro deposition. The volatilizing, or drying, may or may not include the application of heat and/or vacuum to control the rate of volatilization of the solvent. These methods may enable the production of new halide perovskite thin film structures, not producible by conventional means.

In another aspect, a halide perovskite thin film structure is provided. The structure includes a substrate; a pattern of islands of a nucleation promoter material disposed on the substrate; and halide perovskite crystals disposed on the substrate and the islands. In embodiments of this structure, the halide perovskite crystals are contiguously disposed in the form of a film and are generally centered about the islands of nucleation promoter material.

For example, each crystal may be centered on or about one of the islands.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale.

DETAILED DESCRIPTION

The methods disclosed herein enable precise control of nucleation sites and nucleation densities during the formation of halide perovskite thin films on a substrate, and thin films made according to these methods. It was discovered that a thermally-evaporated gold (Au) film can act as a nucleation promoter for both organometal halide perovskites (e.g., methylammonium lead triiodide, MAPbI$_3$ and MAPbBr$_3$) and inorganic halide perovskite (e.g., cesium lead tribromide, CsPbBr$_3$).

In one aspect, a method of forming a halide perovskite thin film is provided. In some embodiments, the method includes (a) forming a plurality of islands of a nucleation promoter material onto a substrate; (b) applying to the substrate and islands a solution which comprises halide perovskite (or precursors thereof) in solution with a volatile liquid (solvent); and then (c) volatilizing (evaporating) the volatile liquid to form a crystalline halide perovskite thin film. The islands of the nucleation promoter material are discrete regions of the material disposed in selected positions on the substrate in an array, or pattern, such as a grid pattern. The nucleation promoter material may be applied to the substrate by any suitable method for forming the islands, for example by a thermal evaporation process. The nucleation promoter material may be gold, or it may be another metal or a metal oxide. The solution of the halide perovskite can be applied to the substrate by any suitable coating process. For example, the coating process may be spin coating or another suitable coating process known in the art, such as vacuum sputtering, ink jet printing, screen printing, or electro deposition. The volatilizing, or drying, may or may not include the application of heat and/or vacuum to control the rate of volatilization of the solvent.

Figure 10:
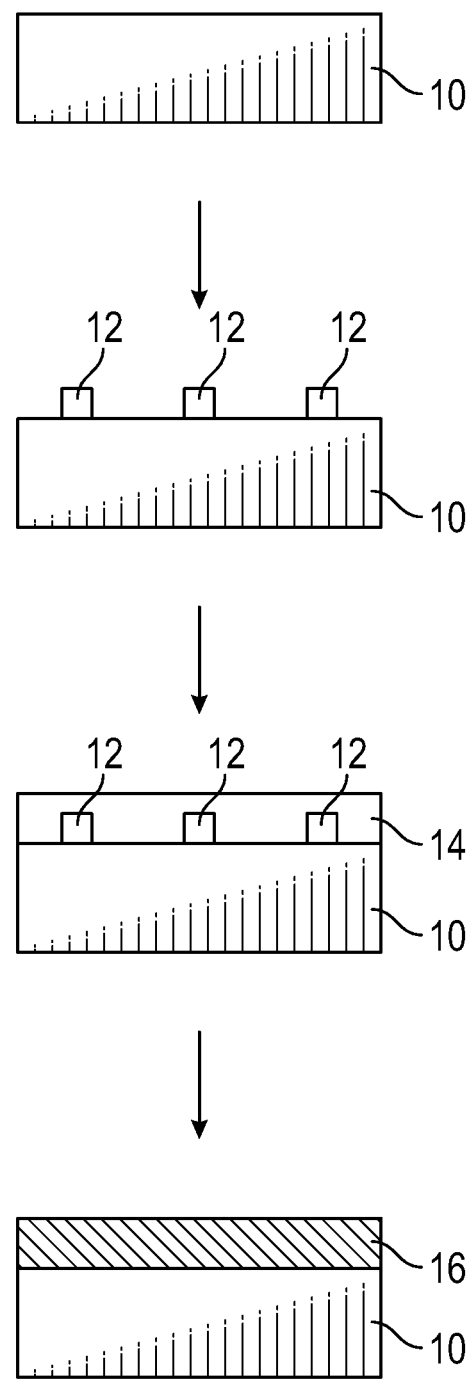
FIG. 10 shows a schematic illustration of a method of making a halide perovskite thin film according to an embodiment of the disclosure.

FIG. 10 shows a schematic illustration of a method of making a halide perovskite thin film according to an embodiment of the disclosure. First, a substrate 10 is provided. Next, islands of nucleation promoter material 12 are formed onto the substrate. Next, a solution 14 including halide perovskite (or precursors thereof) in solution with a volatile liquid is applied to the substrate 10 and the nucleation promoter material 12. Finally, the volatile liquid is volatized to form a crystalline halide perovskite thin film 16 on the substrate to form a crystalline halide perovskite thin film 10.

In another aspect, a halide perovskite thin film structure is provided. The structure includes a substrate; a pattern of islands of a nucleation promoter material disposed on the substrate; and halide perovskite crystals disposed on the substrate and the islands. In embodiments of this structure, the halide perovskite crystals are contiguously disposed in the form of a film and are generally centered about the islands of nucleation promoter material. For example, each crystal may be centered on or about one of the islands.

As used herein, the term "halide perovskite" includes halide perovskite materials having the form of $ABX_3$, wherein A is a suitable +1 cation, B is a suitable +2 cation, and X is a halide −1 anion. For example, in some embodiments, A may be methylammonium ($CH_3NH_3^+$, $MA^+$), formamidinium ($HC(NH_2)_2+$, FA+), or $Cs^+$; B may be lead or tin; and X may be chlorine, bromine, or iodine. Each of A, B, and X can also each be a mixture of two or more of any of the aforementioned cations and anions in any suitable molar ratio. For example, A can be $MA^+$, $FA^+$, and $Cs^+$ of any molar ratio. Non-limiting examples of halide perovskites include $MAPbBr_3$, $MAPbI_3$, and $CsAPbBr_3$.

The substrate can be any suitable substrate material, such as a glass substrate. In some embodiments, the substrate is a silicon oxide ($SiO_2$)/silicon (Si) or indium tin oxide (ITO)/glass substrate.

The islands of nucleation promoter material may be of any suitable size and shape to effect the desired nucleation. In some embodiments, each island is substantially circular and about 4 µm in diameter. In some other embodiments, the islands are elliptical, rectangular, polygonal, or irregularly shaped.

In some embodiments, a pattern of small Au islands is deposited on silicon oxide ($SiO_2$)/silicon (Si) or indium tin oxide (ITO)/glass substrates. Then, by spinning a solution containing the halide perovskite precursors, a film is formed whereby halide perovskite crystals nucleate on the Au islands and grow until neighboring crystals meet and merge into a continuous film. In some embodiments, the size of individual grains is determined by the separation distance (pitch size) between neighboring Au islands. In some embodiments, grains as large as 100 µm are produced with little size variation throughout the film.

The halide perovskite films with large and uniform grains according to embodiments of the present disclosure exhibit enhanced structural and morphological stability in ambient air. For example, efficient light-emission may be observed from $MAPbBr_3$ film even after these films are exposed to air for three months or more without encapsulation. These films may also have greatly reduced ionic migration tendency under an external electrical field.

Photodetectors may be fabricated using films according to the present disclosure, including $MAPbI_3$ films and a metal-semiconductor-metal (MSM) device configuration. Devices made according to the present disclosure may exhibit up to 10 times lower dark current at a 10 V applied voltage compared to control devices with a nanocrystalline $MAPbI_3$ thin film, and may further exhibit no current hysteresis the applied voltage is swept between +/−10 V at both dark and illuminated conditions.

The Au-island pattern for use in thin films according to embodiments of the present disclosure may be formed on Sift/Si or ITO/glass substrates using standard photolithography, metal evaporation and photoresist lift-off processes. Using these methods, the diameter of each Au island is about 4 µm. The pitch size may be varied. For example, in some embodiments the pitch size may be between about 10 µm and about 100 µm, for example about 10 µm, about 20 µm, about 50 µm, about 100 µm, or any range therebetween.

Figure 1A:
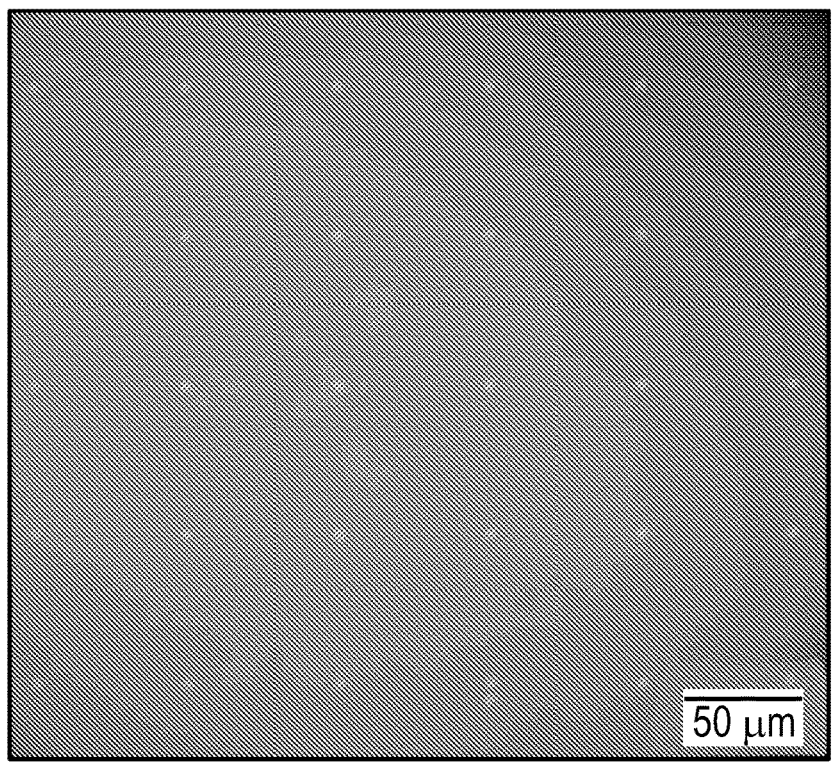
FIG. 1A shows a microscopic optical image of a representative substrate with a 50 μm-pitch Au pattern according to an embodiment of the disclosure.
Figure 1B:
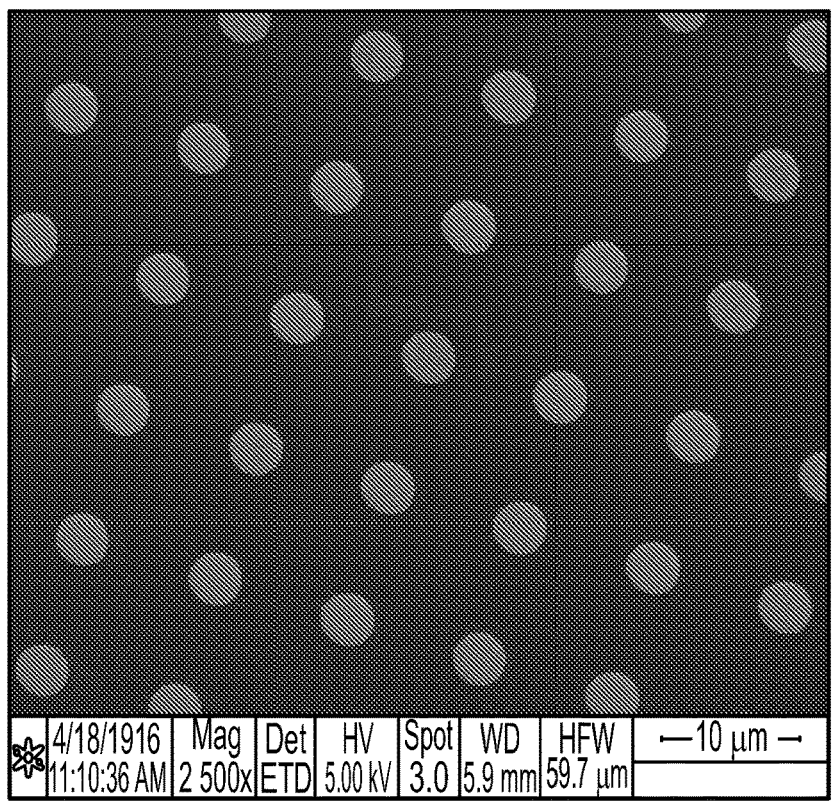
FIG. 1B shows a scanning electron microscopy (SEM) image from a sample with a 10 μm-pitch Au pattern according to an embodiment of the disclosure.
Figure 1C:
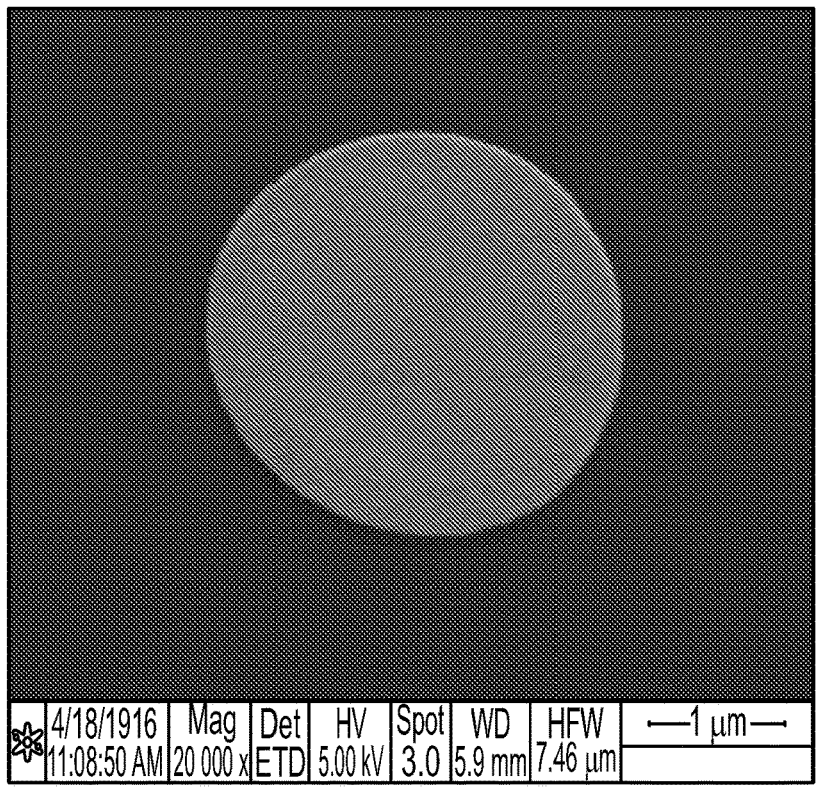
FIG. 1C shows a scanning electron microscopy (SEM) image from a sample with a 10 μm-pitch Au pattern according to an embodiment of the disclosure.

FIG. 1A shows a microscopic optical image of a representative substrate with a 50 µm-pitch Au pattern. FIG. 1B and FIG. 1C are scanning electron microscopy (SEM) images from a sample with a 10 µm-pitch Au pattern.

In some embodiments, to create a thin film, the halide perovskite solution is spin-coated onto the Au patterned substrate and quickly annealed, such as on a hot plate, to volatilize the solvent and crystalize the halide perovskite solution.

Halide perovskite thin films with large and periodical grains can be grown according to embodiments of the present disclosure using patterned Au arrays as nucleation promoters for the perovskite crystals. The size of the grain may be determined by the pitch size of the Au pattern, and can be as large as 100 µm with little variation across the sample. The large grain size advantageously may restrict the ion migration processes in the halide perovskite thin films, leading to photodetectors with a low dark current and a high on/off ratio under a constant bias, and without hysteresis under a dynamic bias. The large grain may also enhance the stability of the halide perovskite thin films in ambient environments. For example, thin films prepared according to embodiments of the present disclosure may exhibit minimal structural or morphological damages in the perovskite after as much as a three-month exposure in air.

EXAMPLES

The devices and methods described herein will be further understood by reference to the following non-limiting examples.

Advantageously, the methods disclosed herein may produce fully continuous perovskite thin films. While prior publications such as Wang et al. have reported the patterned growth of $MAPbI_3$ microplate crystals by depositing periodic $PbI_2$ islands on a substrate and subsequently converting the $PbI_2$ into a perovskite through a reaction with methylammonium iodide, these methods did not achieve fully continuous perovskite thin films, and the size of the crystals could reach about 10 µm. G. Wang, et al., *Sci. Adv.* 2015, 1, e1500613.

For each of the deterministic nucleation examples described below (Examples 2-5), Methylammonium bromide and Methylammonium iodide were purchased from "1-Material Inc". Lead(II) bromide (99.999%), lead(II) iodide (99.999%), N,N-dimethylformamide (DMF, anhydrous, 99.8%), dimethyl sulfoxide (DMSO, anhydrous, 99.9%), gamma butyrolacetone (GBL, anhydrous, 99.9%), and indium-gallium eutectic (99.99%) were obtained from Sigma Aldrich. Similarly, for each of the examples described below, ITO/glass (20Ω $Square^{-1}$) substrates were purchased from Thin Film Devices. The $SiO_2$ (50 nm)/Si substrates were purchased from Silicon Valley Microelectronics, Inc. All materials were used as received.

Next, in each of the examples below the Sift/Si and ITO/glass substrates were subsequently cleaned in acetone, IPA and deionized water for 10 mins each in a bath sonicator and blow dried with nitrogen. Photoresist (AZ5214E, Micro-Chemicals) was spin-coated onto the cleaned $SiO_2$/Si or ITO/glass substrate at 4000 rpm for 70 seconds, and then annealed at 100° C. for 60 seconds to remove residual solvent. The substrate was then exposed to UV light under a patterned dot mask with dot diameter of 3 µm, and the distance between the dots varied from 10 µm, 20 µm, 50 µm and 100 µm. Tetramethylammonium hydroxide (MIF 726, MicroChemicals) was used as the developer. A 5 nm titanium layer and a 50 nm Au layer were subsequently deposited via electron beam evaporation at $10^{-6}$ Torr. The photoresist was then stripped in acetone.

Next, a $MAPbBr_3$ precursor solution was prepared by dissolving $CH_3NH_3Br:PbBr_2$ (1:1 molar ratio) in a DMSO-DMF (75:25 volume ratio) mixture solvent to obtain the desired concentrations. A $MAPbI_3$ precursor solution was prepared by dissolving the $CH_3NH_3I:PbI_2$ (1:1 molar ratio) in a DMSO-GBL (75:25 volume ratio) mixture solvent with desired concentrations.

Example 1—Control Samples

Figure 2A:
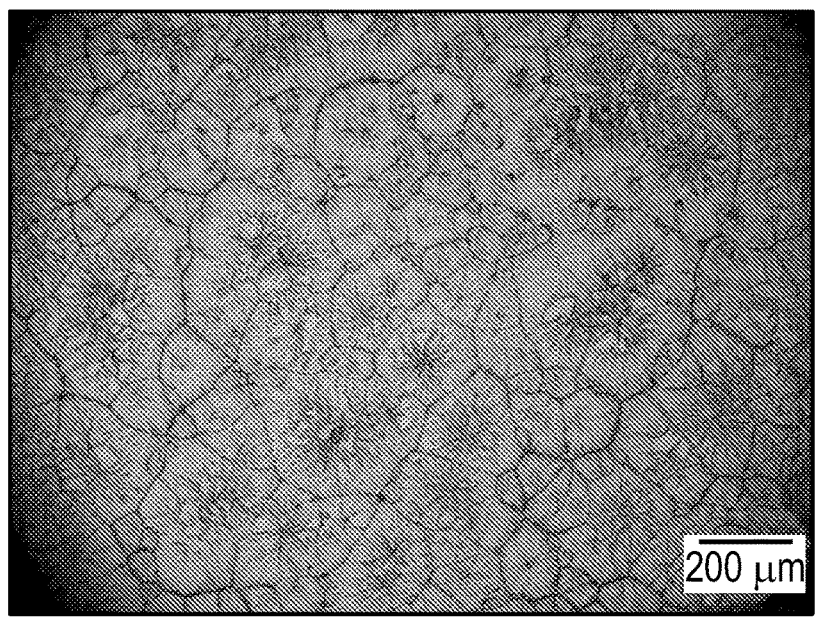
FIG. 2A shows a microscopic optical image of a MAPbI$_3$ film grown on a SiO$_2$/Si substrate according to an embodiment of the disclosure.
Figure 2B:
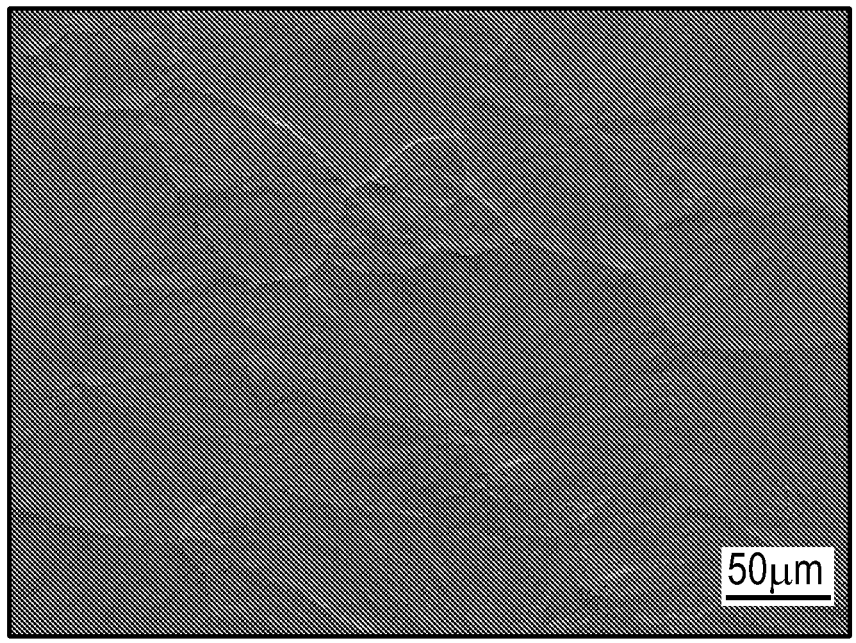
FIG. 2B shows a SEM image of the MAPbI$_3$ film of FIG. 2A.

For control experiments, films were made on Sift/Si substrates without an Au layer, and on non-patterned $Au/SiO_2/Si$ substrates. FIGS. 2A and 2B show a microscopic optical image and a SEM image, respectively, of the as-grown $MAPbI_3$ film on the Sift/Si substrate.

Noticeably, more than half of the examined area was filled with large crystals that were close to or above 200 µm in size. Nonetheless, the crystals largely varied in shapes and heights, and many much smaller crystals can be seen between the large crystals. The results here were in good agreement with the work by Nie et al. where a hot perovskite-containing solution was spun-coated onto a poly(3,4-ethylenedioxythiophene)-poly(styrenesulfonate)/fluorine-doped tin oxide substrate. W. Nie et al., *Science* 2015, 347, 522. The high temperature process enhances the diffusivity of the precursor molecules on the substrate, leading to a low nucleation density, and thus a large average grain size in the samples shown in FIGS. 2A and 2B, and in Nie's samples.

Figure 2C:
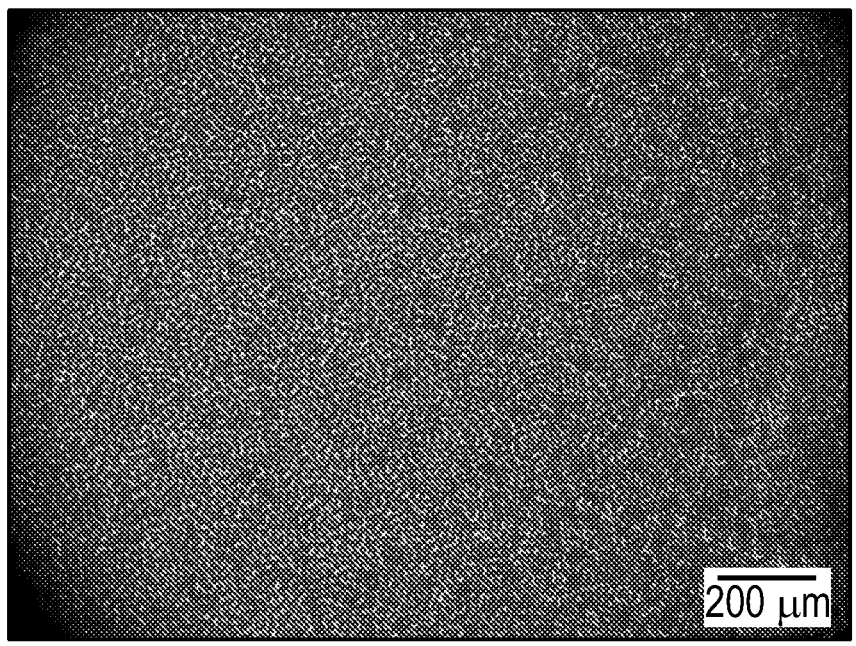
FIG. 2C shows a microscopic optical image of a MAPbI$_3$ film grown on a Au/SiO$_2$/Si substrate according to an embodiment of the disclosure.
Figure 2D:
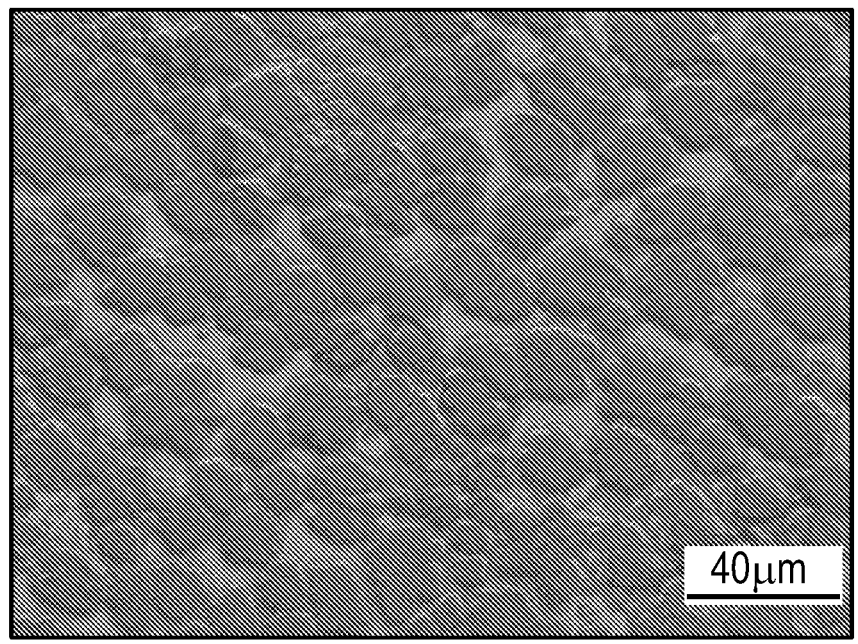
FIG. 2D shows a SEM image of the MAPbI$_3$ film of FIG. 2C.

FIGS. 2C and 2D show a microscopic optical image and a SEM image, respectively, of the as-grown $MAPbI_3$ film on the $Au/SiO_2/Si$ substrate. As is seen by these figures, the $MAPbI_3$ film grown on the non-patterned $Au/SiO_2/Si$ substrate (FIGS. 2C and 2D) appeared to have a greatly reduced grain size (5-10 µm) when compared to the $MAPbI_3$ film grown on the $SiO_2/Si$ substrate (FIGS. 2A and 2B). This observation suggests that the thermally-evaporated Au promoted nucleation of the $MAPbI_3$. While not intending to be bound by theory, the underlying mechanism is possibly due to a catalytic interaction between Au and $MAPbI_3$. Further, a lower interfacial energy was obtained compared to the $MAPbI_3/SiO_2$ interface, reducing the energetic barrier for the nucleus formation process.

Example 2—$MAPbI_3$ Thin Films

Three $Au/SiO_2/Si$ substrates were prepared with a 100 µm pitch size (100 µm between the dots). The substrates were exposed to oxygen plasma (100 sccm, 100 W) for four minutes. Three different $MAPbI_3$ precursor solutions were prepared at concentrations of a) 0.5 M, b) 0.75M and c) 1.0 M. Each $MAPbI_3$ precursor solution was spun at 1250 rpm for 60 seconds in a nitrogen atmosphere, and the samples were then transferred to a hotplate and annealed for 10 seconds at 180° C.

SEM images of the completed substrates were acquired using a field emission SEM (JEOL 7401F). The acceleration voltage was set at 5 kV, and powder XRD patterns were recorded using an XRD (X'PERT Pro MPD) equipped with a Cu kα radiation source.

Figure 3A:
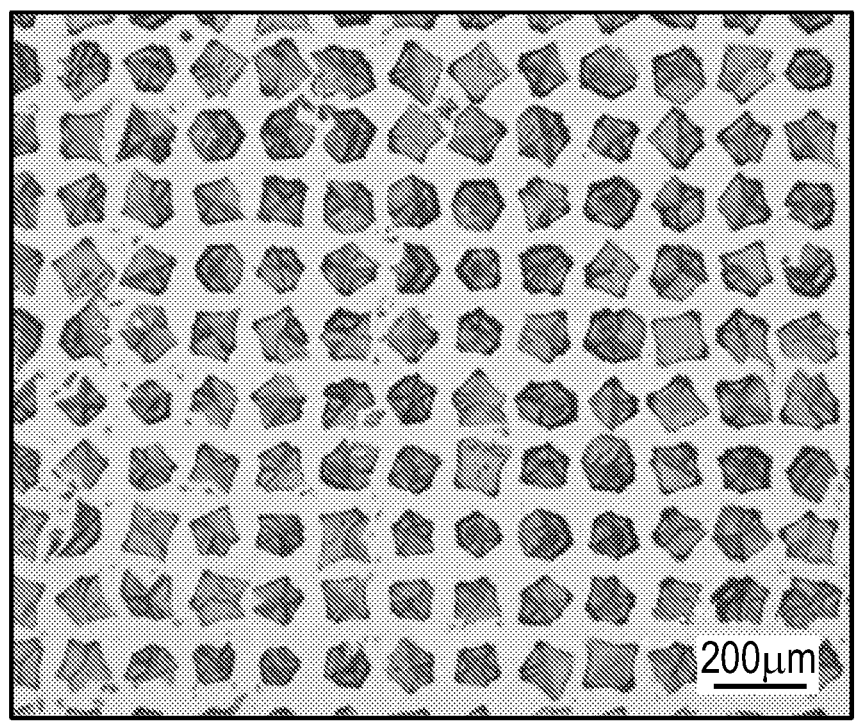
FIG. 3A shows a microscopic optical image of a 0.5M MAPbI$_3$ sample according to an embodiment of the disclosure.

FIG. 3A shows a microscopic optical image of the 0.5M $MAPbI_3$ sample described above.

Figure 3B:
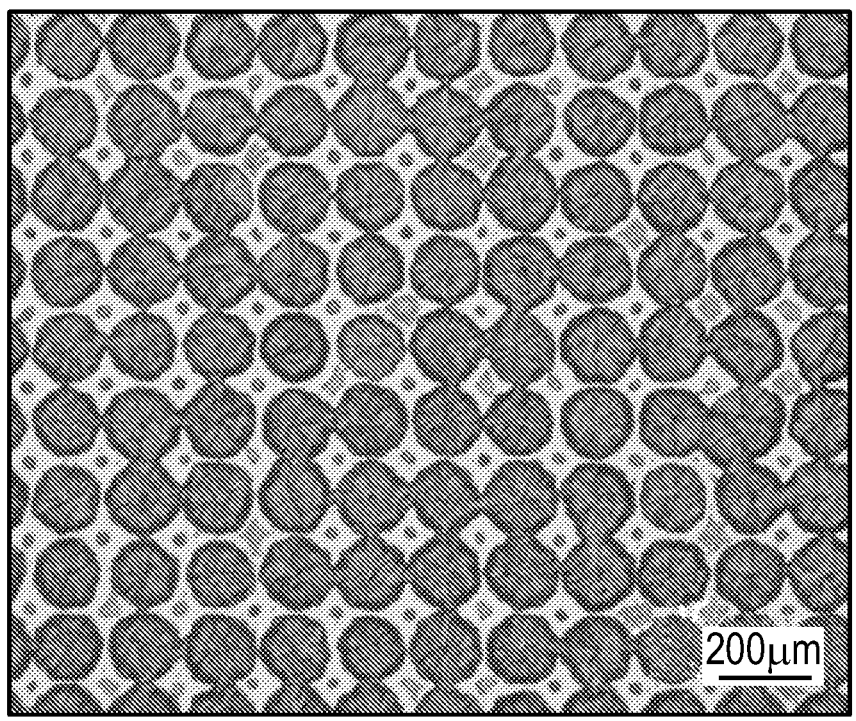
FIG. 3B shows a microscopic optical image of a 0.75M MAPbI$_3$ sample according to an embodiment of the disclosure.

FIG. 3B shows a microscopic optical image of the 0.75M $MAPbI_3$ sample described above.

Figure 3C:
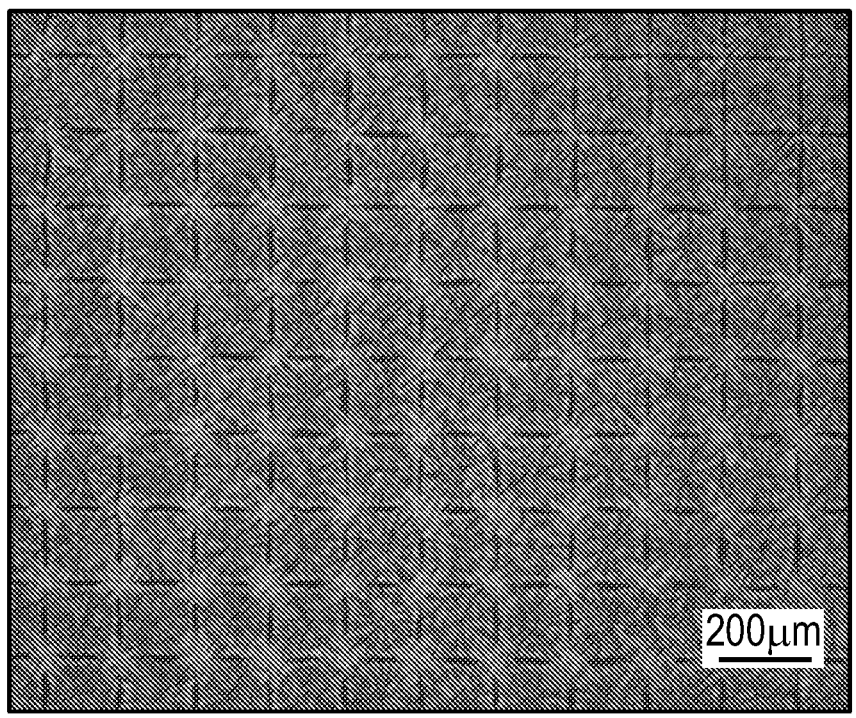
FIG. 3C shows a microscopic optical image of a 1.0M MAPbI$_3$ sample according to an embodiment of the disclosure.

FIG. 3C shows a microscopic optical image of the 1.0M $MAPbI_3$ sample described above.

Figure 3D:
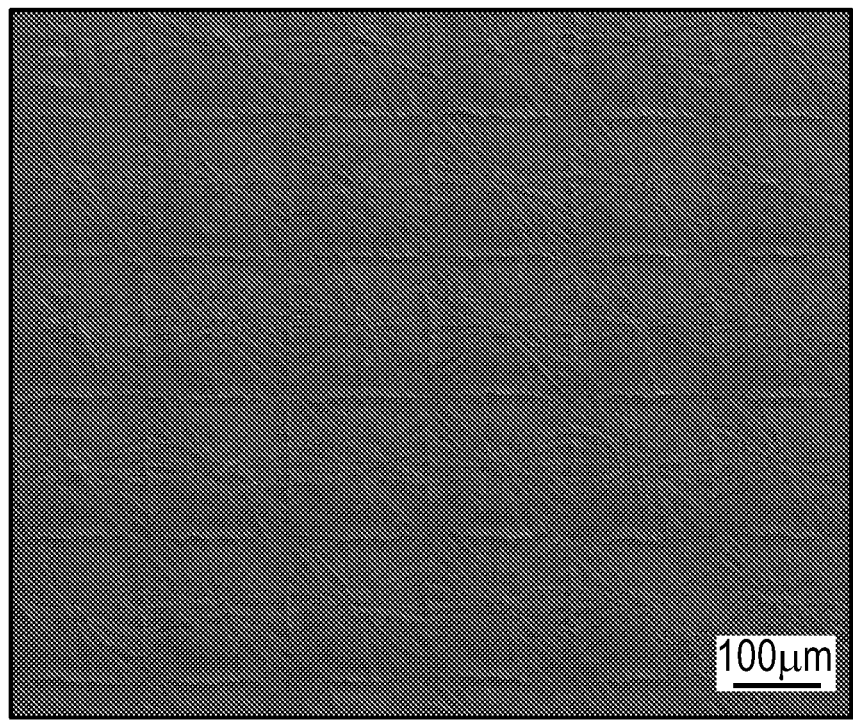
FIG. 3D shows a SEM topological image of the sample of FIG. 3C.

FIG. 3D shows a SEM topological image of the sample of FIG. 3C.

Figure 3E:
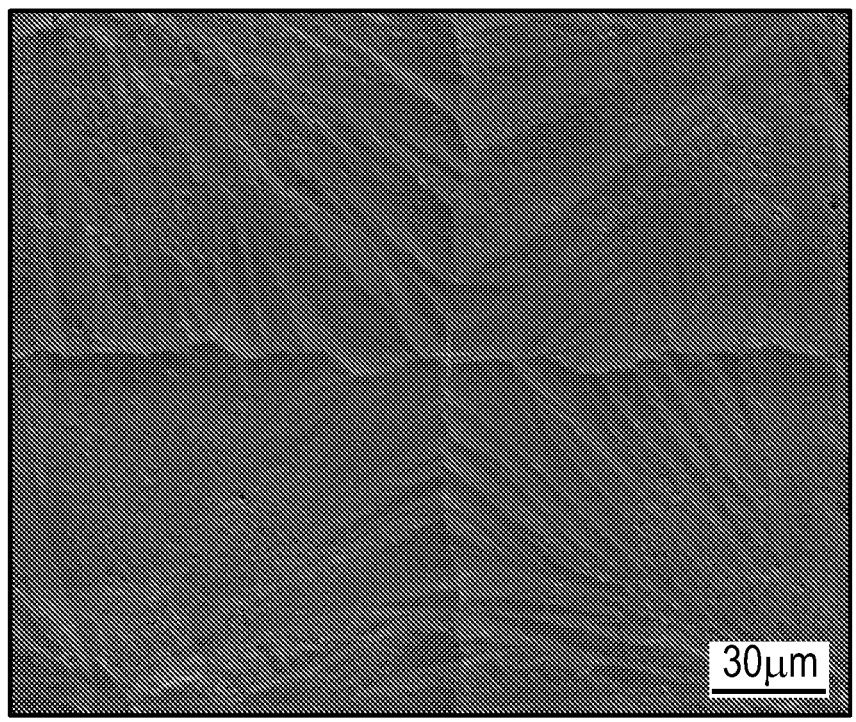
FIG. 3E shows a SEM topological image of the sample of FIG. 3C.

FIG. 3E shows a SEM topological image of the sample of FIG. 3C.

Figure 3F:
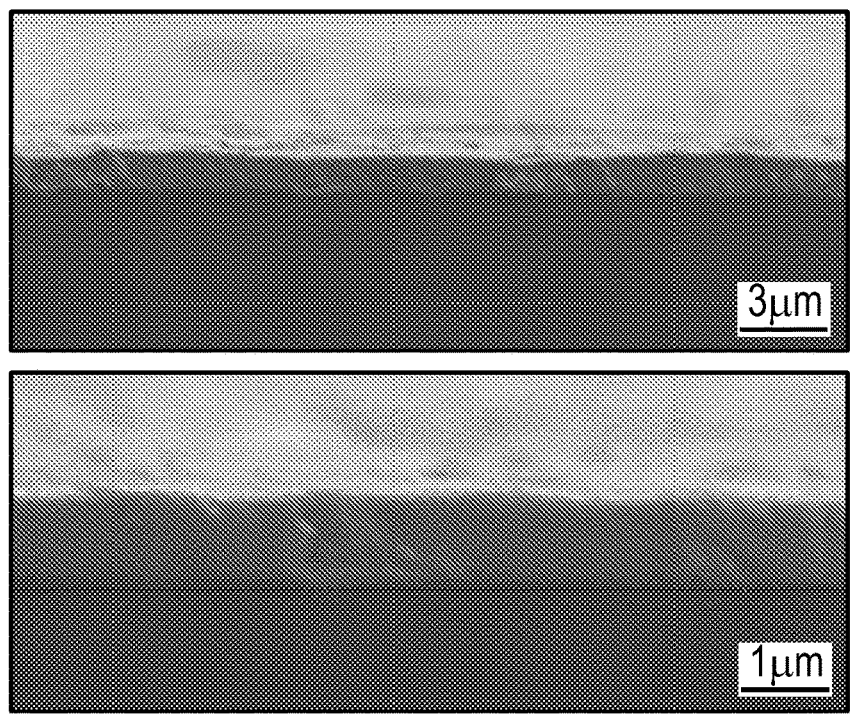
FIG. 3F shows a cross-sectional SEM image of the sample of FIG. 3C.

FIG. 3F shows a cross-sectional SEM image of the sample of FIG. 3C.

By growing the film on a patterned $Au/SiO_2/Si$ substrate with 100 µm pitch size, the perovskite grains became much more uniform than those shown in Example 1 above, and a continuous film was obtained as shown in FIGS. 3A-3F. While not intending to be bound by theory, this suggests that the Au has a catalytic effect on the crystallization of $MAPbI_3$ on the substrate.

The catalytic effect of the Au was further confirmed by the microscopic optical images shown in FIGS. 3A-3C. For example, as shown in FIG. 3A, separated $MAPbI_3$ islands were obtained when 0.5 M concentration $MAPbI_3$ precursor solution was used. The crystals were all faceted and their positions aligned very well with the starting Au pattern. When a 0.75 M $MAPbI_3$ precursor solution was used, the perovskite crystals showed a tendency to meet at the edges and evolved into a more rounded shape, as shown in FIG. 3B.

When a 1.0 M $MAPbI_3$ precursor solution was used, the crystals merged into a fully continuous film that took a square shape. In this film, all the grains were nearly the same size, 100 µm, matching the pitch size of the starting Au pattern. This result further verifies that nucleation only occurred on the Au islands on the patterned Au/Sift/Si substrate.

FIGS. 3D and 3E show the SEM topological images of the $MAPbI_3$ film in FIG. 3C, confirming the periodic arrangement of the constituent grains and a grain size of 100 µm with nearly no variance. As can be seen from these images, each of the crystals appears to have lines emanating from the center to the edges, suggesting that the crystals propagated out from the gold dot during growth. These images also confirm that the film was also dense without pin-holes. Finally, the cross-sectional SEM images in FIG. 3F reveal that the film is about 700 nm thick, and relatively consistent across the film.

Next, current-voltage characteristics were measured with a Keithley 2410 source meter, and an electroluminescence spectrum was collected using a confocal Raman system (Renishaw).

Figure 5:
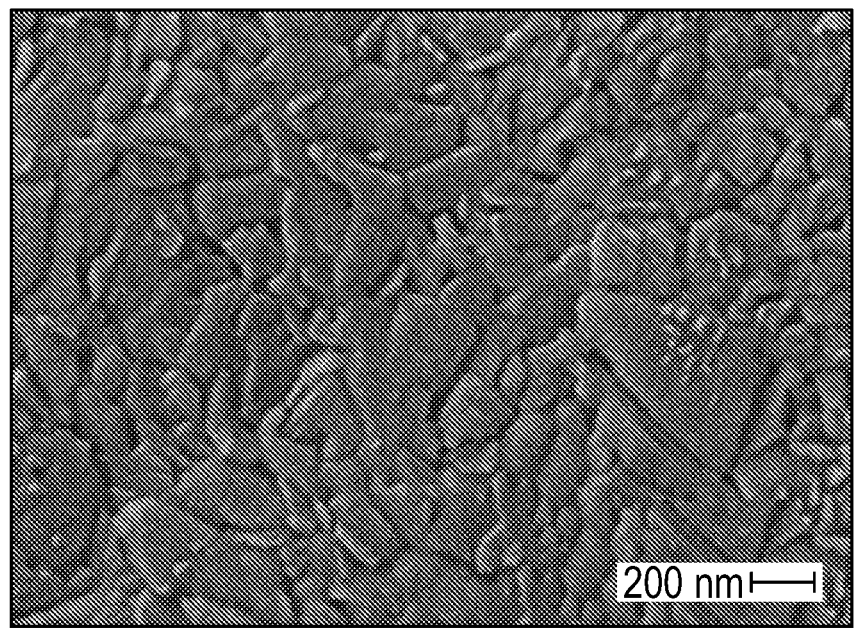
FIG. 5 shows a microscopic optical image of a nanocrystalline MAPbI$_3$ film prepared following a reported procedure by Jeon et al.

Two Au contact electrodes were evaporated on top of the $MAPbI_3$ film. Then, a shadow mask was used to define an electrode area of 2 mm by 2 mm, and a separation (channel length) of 50 µm between the opposite electrodes. As control samples, nano-crystalline $MAPbI_3$ films were also prepared following a reported procedure by Jeon et al. N. J. Jeon, et al., *Nat. Mater.* 2014, 13, 897. As shown in FIG. 5, all crystals of this control sample had sizes between 50 nm to 200 nm.

Figure 4A:
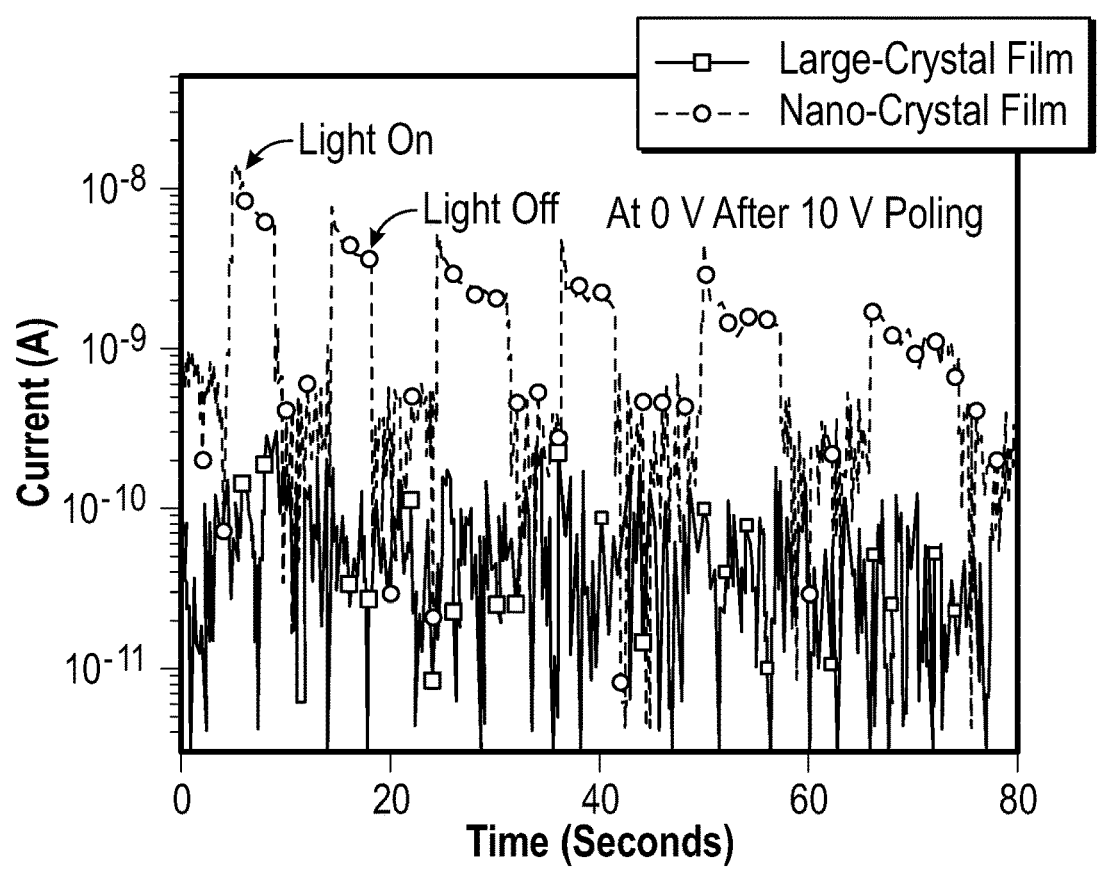
FIG. 4A shows the I-t responses of a sample made according to an embodiment of the present disclosure both in dark and under light illumination.

Current-time (I-t) and current-voltage (I-V) characteristics were collected for devices with large- and nano-crystal $MAPbI_3$ films, respectively. The results in FIG. 4A show the I-t responses both in dark and under light illumination. The devices were first poled for 30 seconds at 10 V correlating to an electrical field of 0.2 V µm$^{-1}$ within the channel region, then measurements were taken under a short circuit condition. The device current with the large-crystal film was ~0.1 nA at dark condition, and the photocurrent was not discernable under light irradiation. In comparison, the device with the nano-crystal film exhibited a dark current of ~0.3 nA. A noticeable current rise was observed when the light was turned on, after which the photocurrent showed a slightly decaying trend with time.

It has been reported that the ionic species in the halide perovskites including the methylammonium ($CH_3NH_3^+$) cations and the halide ($X^-$) anions could migrate under an external electrical field. The migration of the ions can cause the halide perovskite to become p-doped and n-doped next to the anode and cathode, respectively.

Figure 4B:
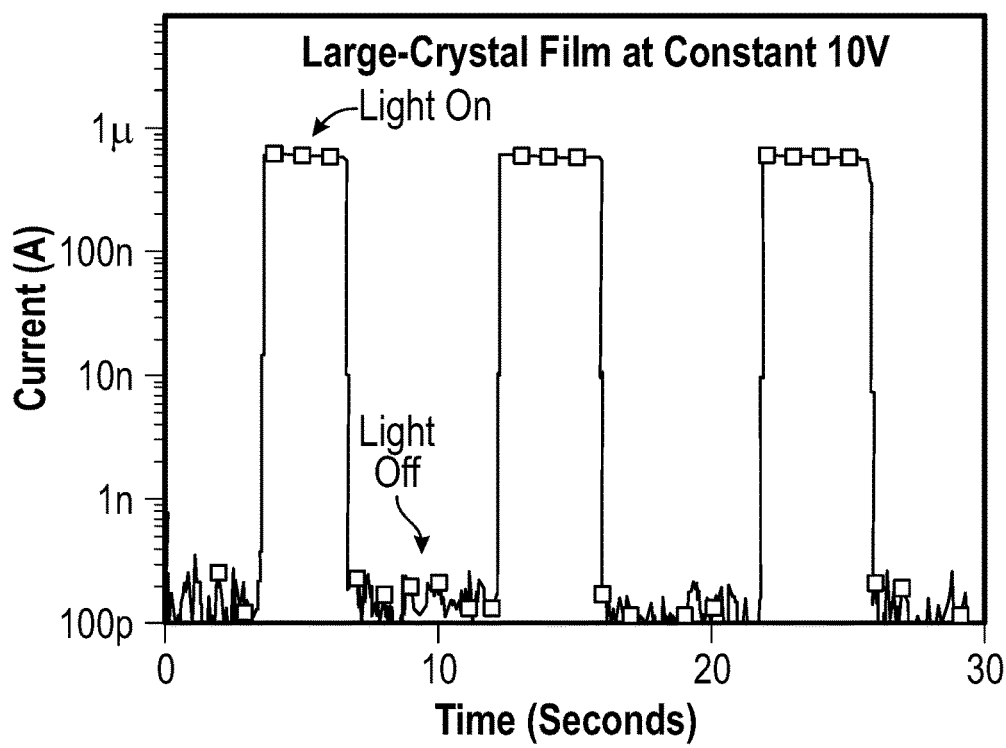
FIG. 4B shows the current measurements of a large-crystal film of the present disclosure at a constant 10 V bias.
Figure 4C:
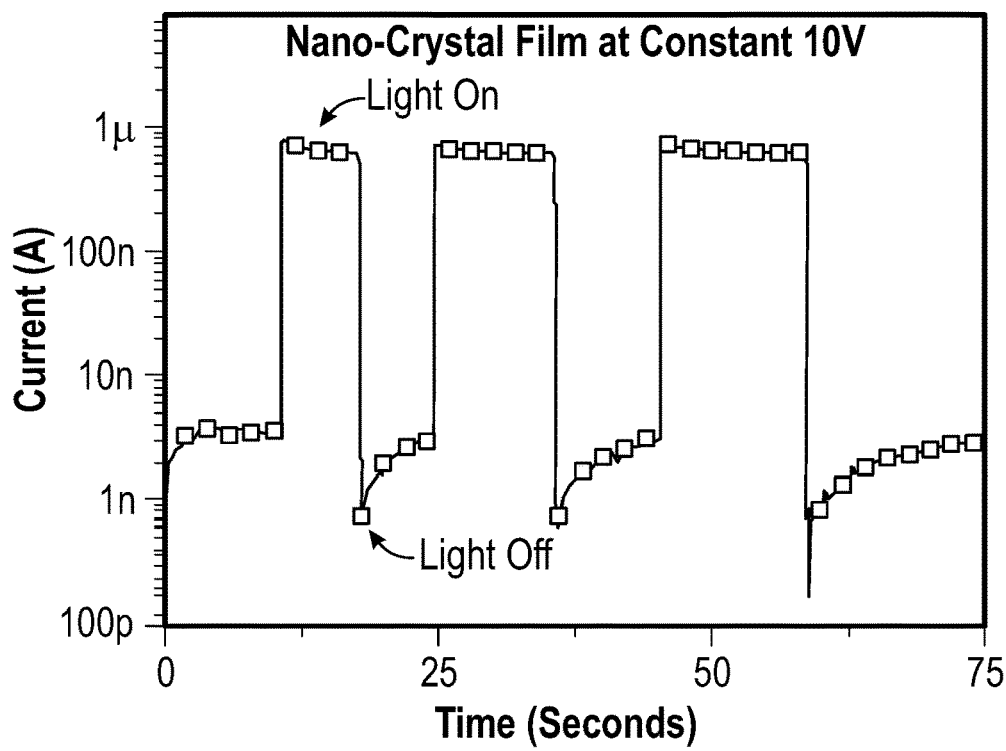
FIG. 4C shows the current measurements of a nano-crystal film of the present disclosure at a constant 10 V bias.

The formation of such interfacial layers to aid hole and electron collection agrees well with the photocurrent observation in the 10 V polarized device with the nano-crystal $MAPbI_3$ film. Its time-dependent decay likely indicates the disappearing of the doped perovskites due to ion migration back to their equilibrium positions at 0 V bias. In distinction to the nano-crystal film, no doped region formed in the large-crystal film after 10 V poling, suggesting the ions were largely immobilized during the poling process. This conclusion was further supported by current measurements at a constant 10 V bias as shown in FIGS. 4B and 4C. It can be seen from these figures that the large-crystal sample exhibits no charging behavior, and both the dark and photo currents remain constant with time. In contrast, the film with nano-crystal $MAPbI_3$ exhibits a clear charging behavior in both the dark and illuminated states, contributing to the rising and decaying trends of dark and photo currents with time, respectively. In addition, the ratio of photo and dark current (on/off) is 3,600 for the device with a large-crystal film and ~210 with the nano-crystal film.

Figure 4D:
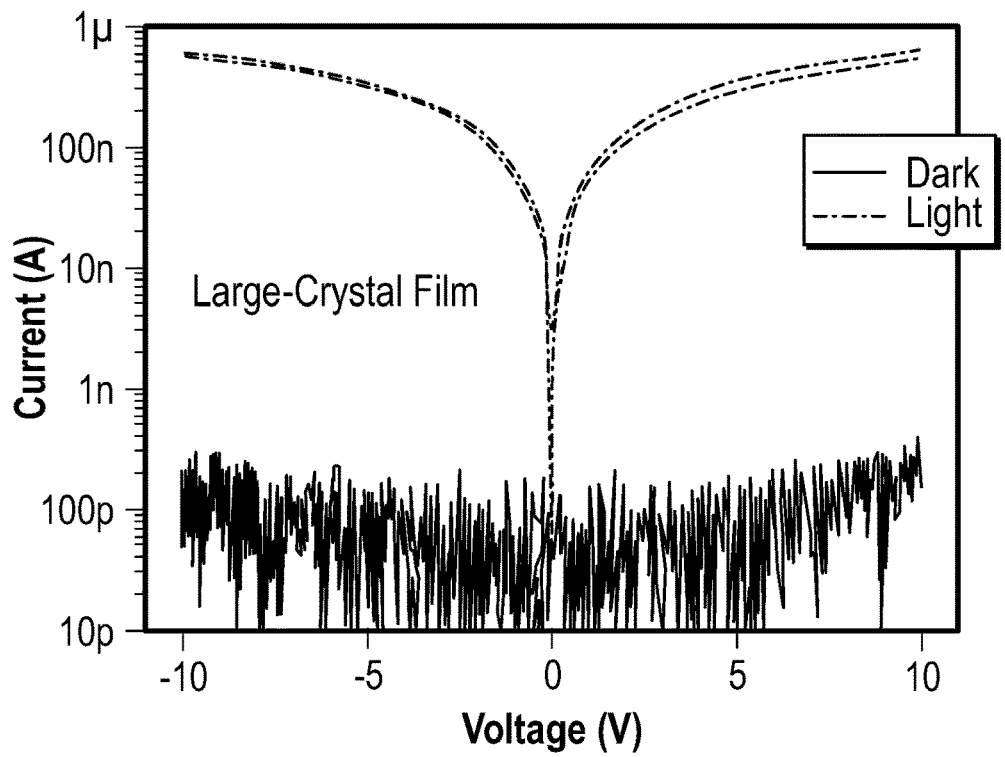
FIG. 4D shows the I-V measurements of a large-crystal film according to an embodiment of the present disclosure.
Figure 4E:
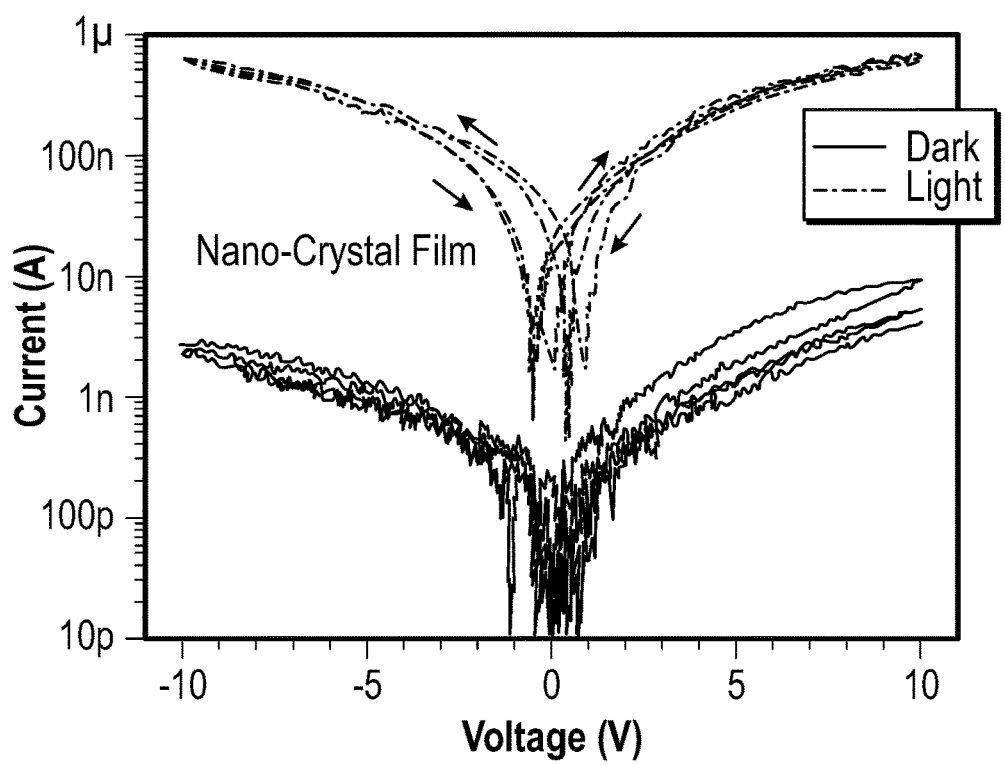
FIG. 4E shows the I-V measurements of a nano-crystal film according to an embodiment of the present disclosure.

I-V measurements were also performed in both dark and illuminated conditions for the large-crystal and nano-crystal films. The applied voltage was swept at a rate of 0.5 V s$^{-1}$ between −10 V and +10 V for total four cycles. The results are shown in FIGS. 4D and 4E. The arrows in FIG. 4E indicate the voltage sweeping direction. From these figures, it can be seen the large-crystal sample had nearly the same photocurrent and dark current at a specified voltage for all the four scanning cycles. However, a large hysteresis could be observed in the nano-crystal sample.

Further, there was no open circuit voltage ($V_{oc}$) under light illumination for the large-crystal sample. In contrast, a $V_{oc}$ of 0.4-0.9 V was measured in the nano-crystal film when the voltage was scanned from +10 V to −10 V, and around −0.5 V was measured when the voltage was scanned from −10 V to +10 V at an illuminated condition. While not intending to be bound by theory, ion migration is hypothesized to be one of the major causes for the commonly observed I-V hysteresis in halide perovskite solar cells. Thus, observing hysteresis-free I-V characteristic in FIG. 4F further confirms that the ions are much less mobile in the large-crystal $MAPbI_3$ film. In a polycrystalline halide perovskite thin film, it has been observed that the ions dominantly migrate through the grain boundaries. Such pathways are substantially diminished in the large-crystal film prepared according to embodiments of the present disclosure.

Current-voltage measurements were taken in both dark and light illumination conditions for the large-crystal $MAPbI_3$ films (FIG. 4F) and nano-crystal $MAPbI_3$ films (FIG. 4G). The applied voltage was swept at a rate of 0.5 V per second between −10V and +10V for a total of four cycles. The arrows in FIG. 4G indicate the voltage sweeping direction.

Example 3—$MAPbBr_3$ Thin Films

Following the deterministic nucleation of the $MAPbI_3$ as described in Example 2 above, this approach was extended for $MAPbBr_3$ thin film fabrication. Again, the film coverage could be controlled through the concentrations of the precursor solution.

Three Au/Sift/Si substrates were prepared with a 50 μm pitch size (50 μm between the dots). The substrates were exposed to oxygen plasma (100 sccm, 100 W) for four minutes. Three different $MAPbBr_3$ precursor solutions were prepared at concentrations of a) 0.5 M, b) 0.75M and c) 1.0 M. Each $MAPbBr_3$ precursor solution was spun at 1250 rpm for 60 seconds in a nitrogen atmosphere, and the samples were then transferred to a hotplate and annealed for 10 seconds at 200° C.

SEM images of the completed substrates were acquired using a field emission SEM (JEOL 7401F). The acceleration voltage was set at 5 kV, and powder XRD patterns were recorded using an XRD (X'PERT Pro MPD) equipped with a Cu kα radiation source.

Figure 6A:
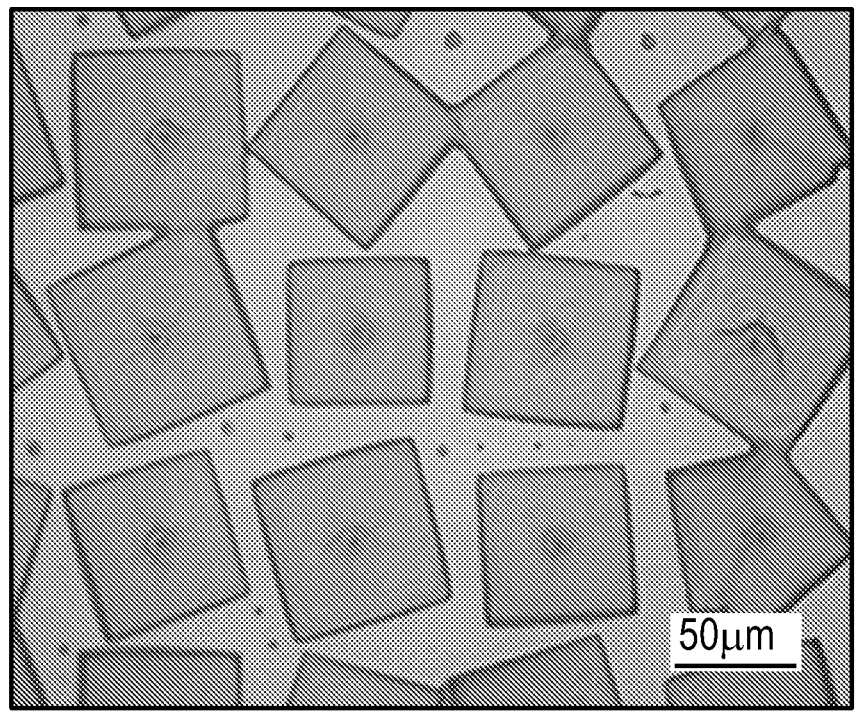
FIG. 6A shows a microscopic optical image of a 0.5M MAPbBr$_3$ sample according to an embodiment of the present disclosure.

FIG. 6A shows a microscopic optical image of the 0.5M $MAPbBr_3$ sample described above. As can be seen from this figure, the crystals formed from this solution were well faceted and many of them were cubic in shape.

Figure 6B:
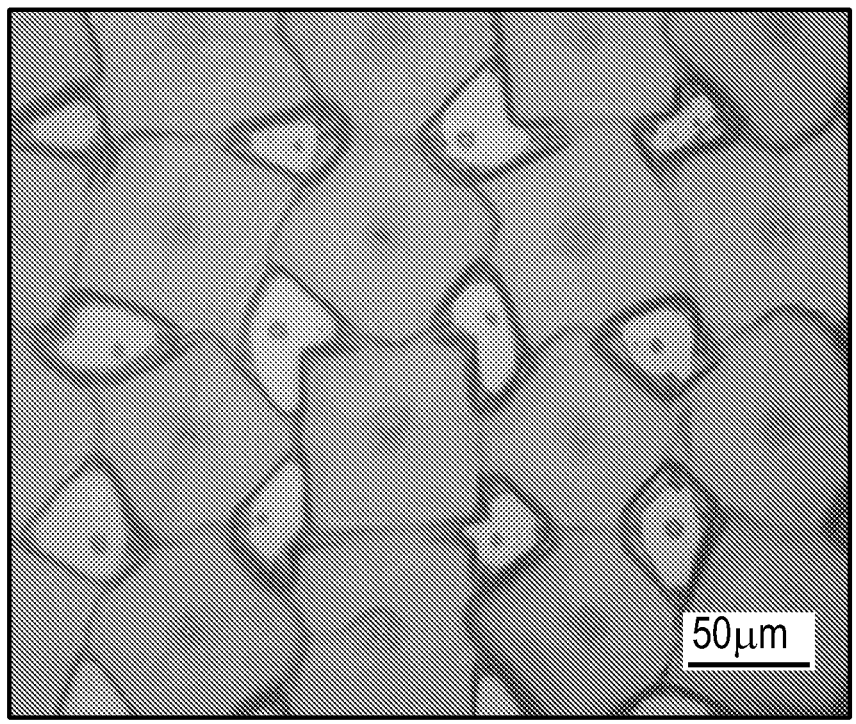
FIG. 6B shows a microscopic optical image of a 0.75M MAPbBr$_3$ sample according to an embodiment of the present disclosure.

FIG. 6B shows a microscopic optical image of the 0.75M $MAPbBr_3$ sample described above. As seen in FIG. 6B, the crystals began to merge at this concentration, so that it appears that the boundaries began to roughen.

Figure 6C:
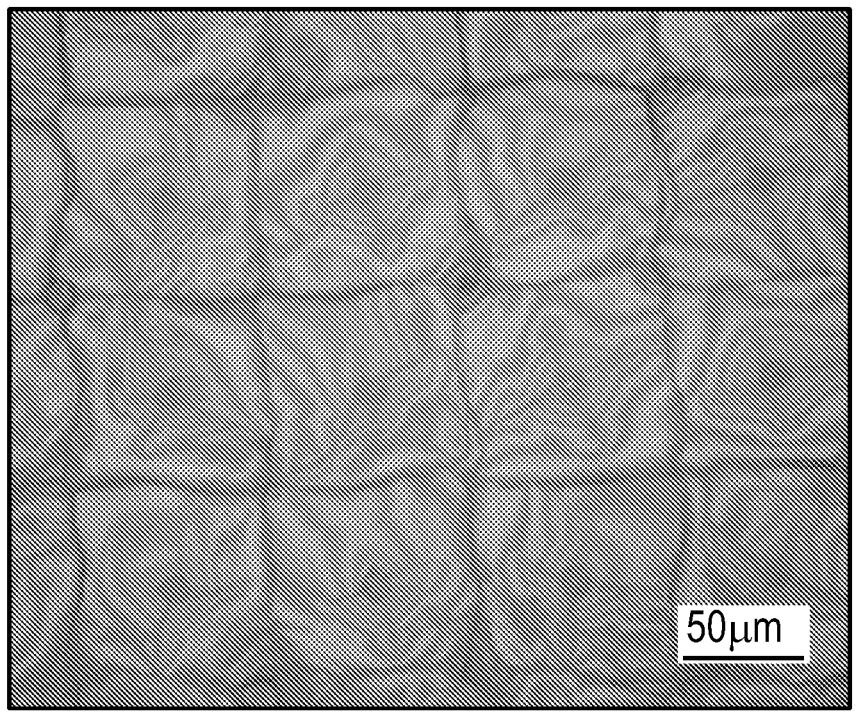
FIG. 6C shows a microscopic optical image of a 1.0M MAPbBr$_3$ sample according to an embodiment of the present disclosure.

FIG. 6C shows a microscopic optical image of the 1.0M $MAPbBr_3$ sample described above. This film is fully dense, and shows that all crystals were about 50 μm large and strongly periodic, following the starting Au pattern.

Figure 6D:
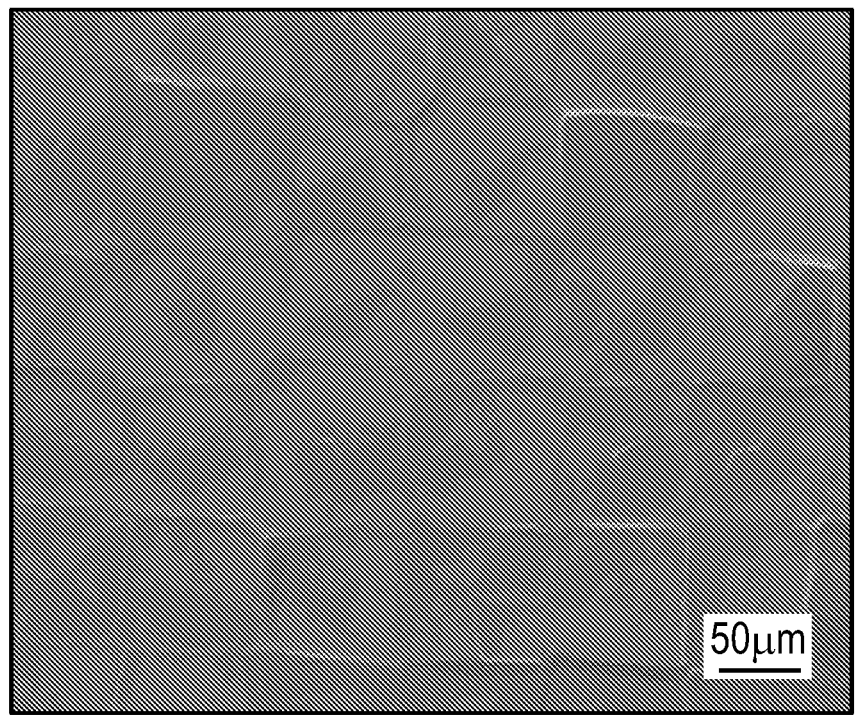
FIG. 6D shows a SEM topological image of the sample of FIG. 3C.
Figure 6E:
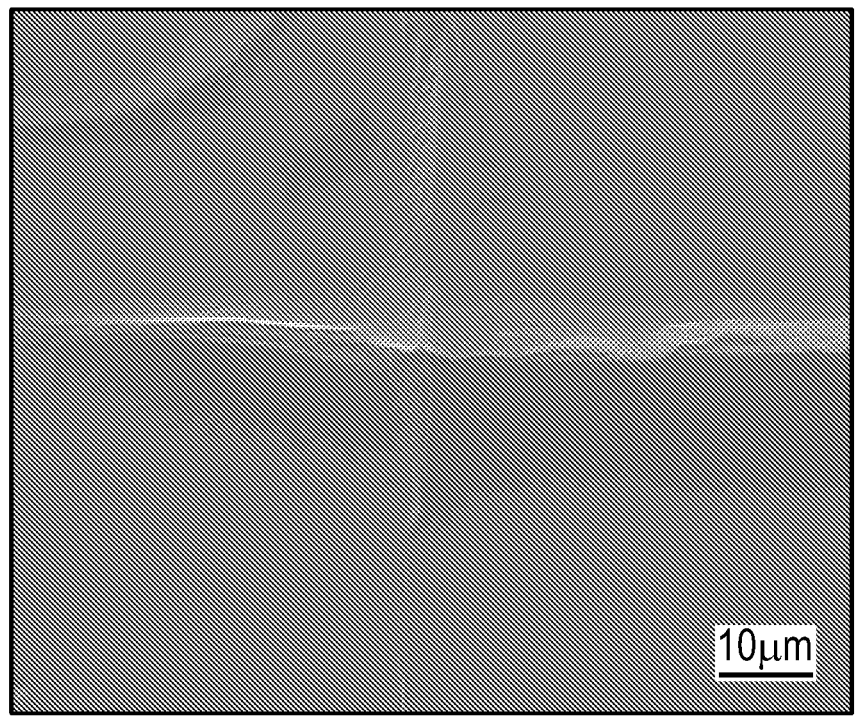
FIG. 6E shows a SEM topological image of the sample of FIG. 3C.

FIGS. 6D and 6E show a SEM topological image of the sample of FIG. 3C. These images show the smooth surface of the $MAPbBr_3$ crystals, suggesting the high quality of these crystals. Further, these images show that there were no observed pinholes in the film.

Figure 6F:
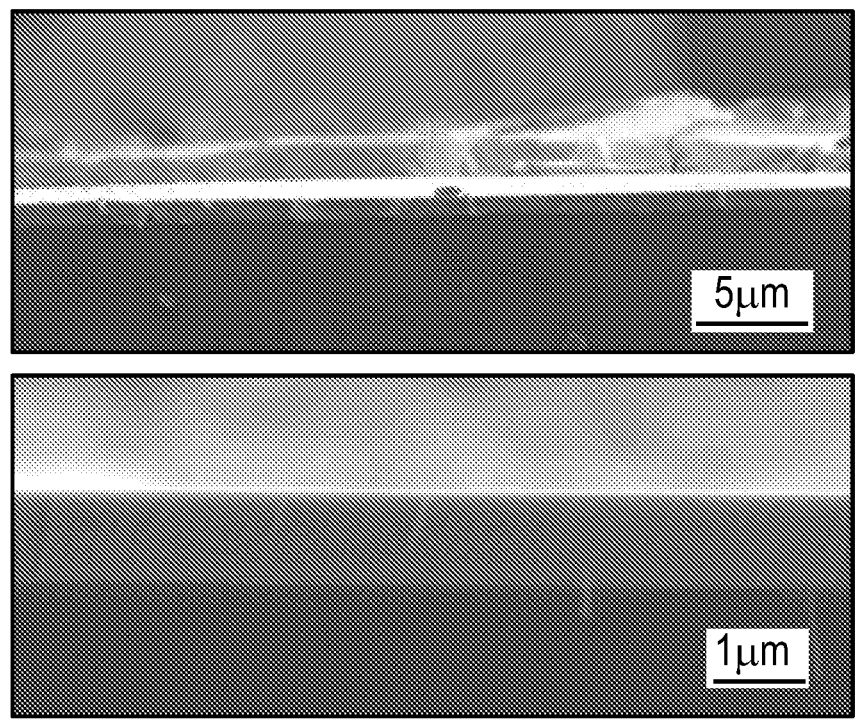
FIG. 6F shows a cross-sectional SEM image of the sample of FIG. 3C.

FIG. 6F shows a cross-sectional SEM image of the sample of FIG. 3C. This shows that the $MAPbBr_3$ film had a thickness of about 670 nm and an extremely sharp interface with no discernable surface roughness.

Example 4—$MAPbBr_3$ and $CsPbBr_3$ Thin Films

Four $Au/SiO_2/Si$ substrates were prepared—two with a 10 μm pitch size and two with a 20 μm pitch size (10 μm and 20 μm between the dots, respectively). The substrates were exposed to oxygen plasma (100 sccm, 100 W) for four minutes.

Two different precursor solutions were prepared—one $MAPbBr_3$ precursor solution and one $CsPbBr_3$ precursor solution. Each precursor solution was spun at 1250 rpm for 60 seconds in a nitrogen atmosphere, and the samples were then transferred to a hotplate and annealed for 10 seconds at 200° C.

SEM images of the completed substrates were acquired using a field emission SEM (JEOL 7401F). The acceleration voltage was set at 5 kV. Powder XRD patterns were recorded using an XRD (X'PERT Pro MPD) equipped with a Cu kα radiation source.

Finally, current-voltage characteristics were measured with a Keithley 2410 source meter, and an electroluminescence spectrum was collected using a confocal Raman system (Renishaw).

Figure 7A:
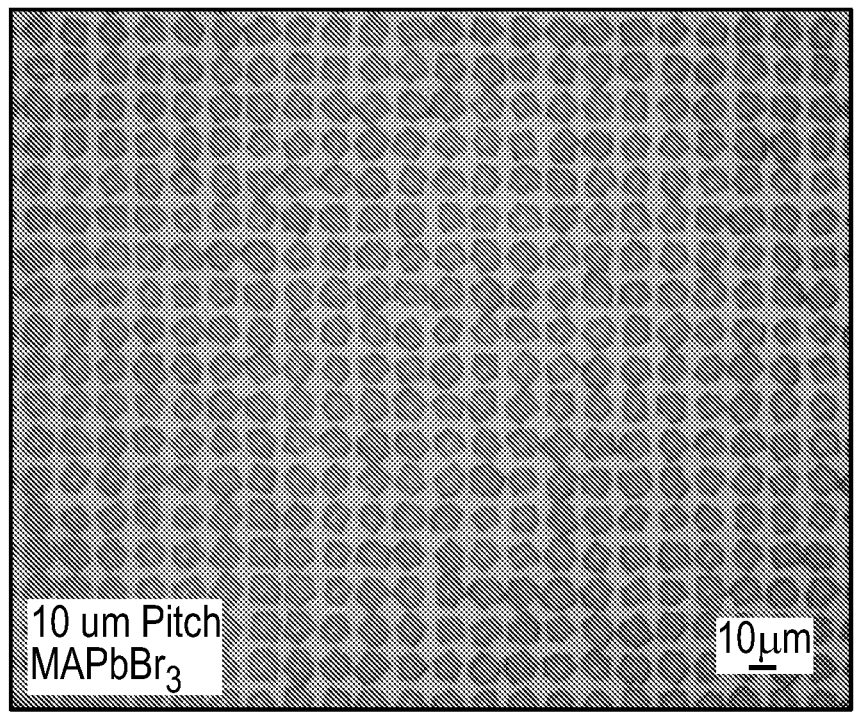
FIG. 7A shows a microscopic optical image of a MAPbBr$_3$ sample according to an embodiment of the present disclosure.

FIG. 7A shows a microscopic optical image of the $MAPbBr_3$ sample on a substrate having a 10 μm pitch size, as described above.

Figure 7B:
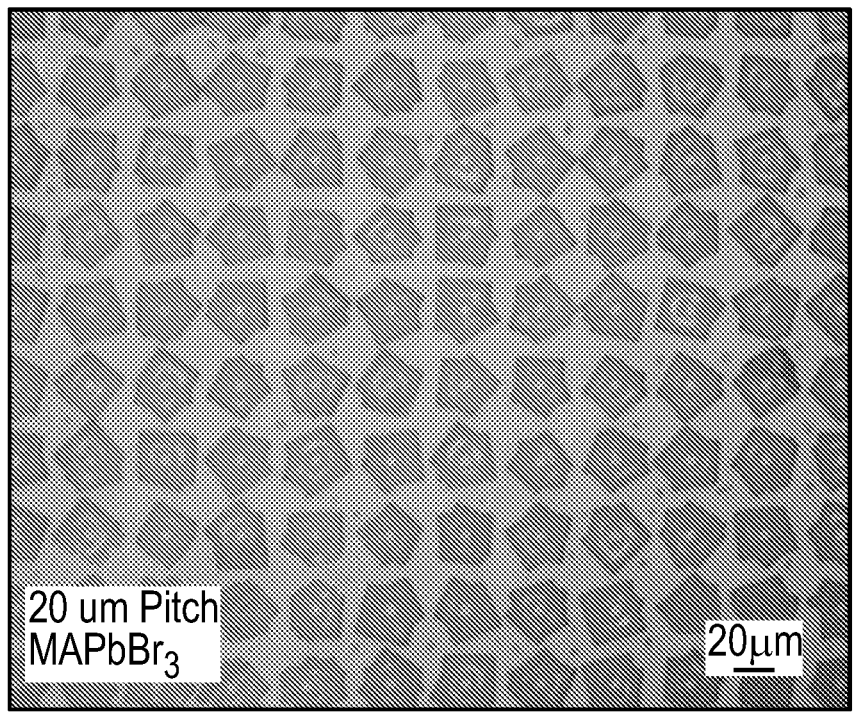
FIG. 7B shows a microscopic optical image of a MAPbBr$_3$ sample according to an embodiment of the present disclosure.

FIG. 7B shows a microscopic optical image of the $MAPbBr_3$ sample on a substrate having a 20 μm pitch size, as described above.

Figure 7C:
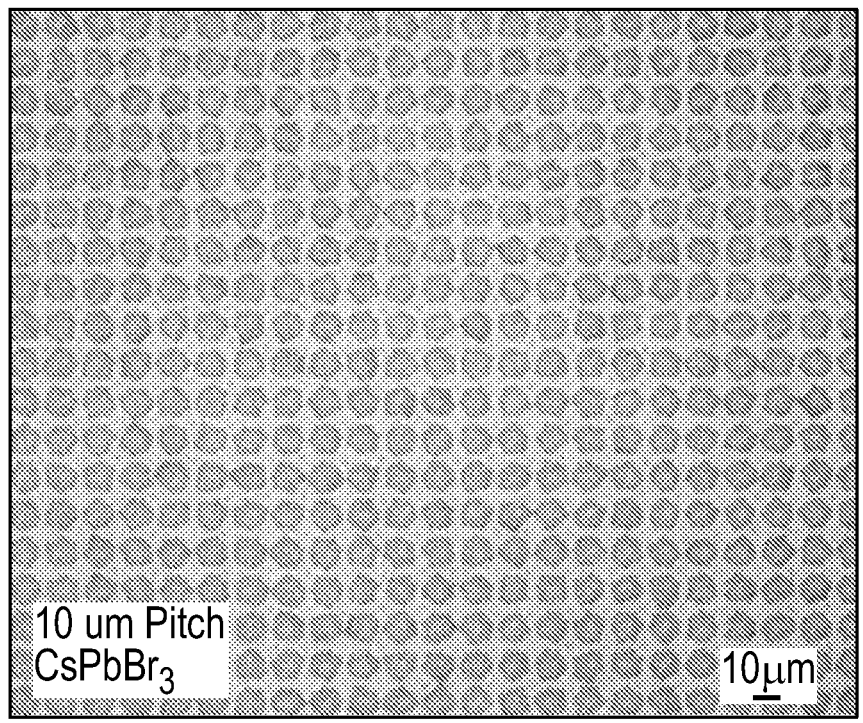
FIG. 7C shows a microscopic optical image of a CsPbBr$_3$ sample according to an embodiment of the present disclosure.

FIG. 7C shows a microscopic optical image of the CsPbBr$_3$ sample on a substrate having a 10 μm pitch size, as described above.

Figure 7D:
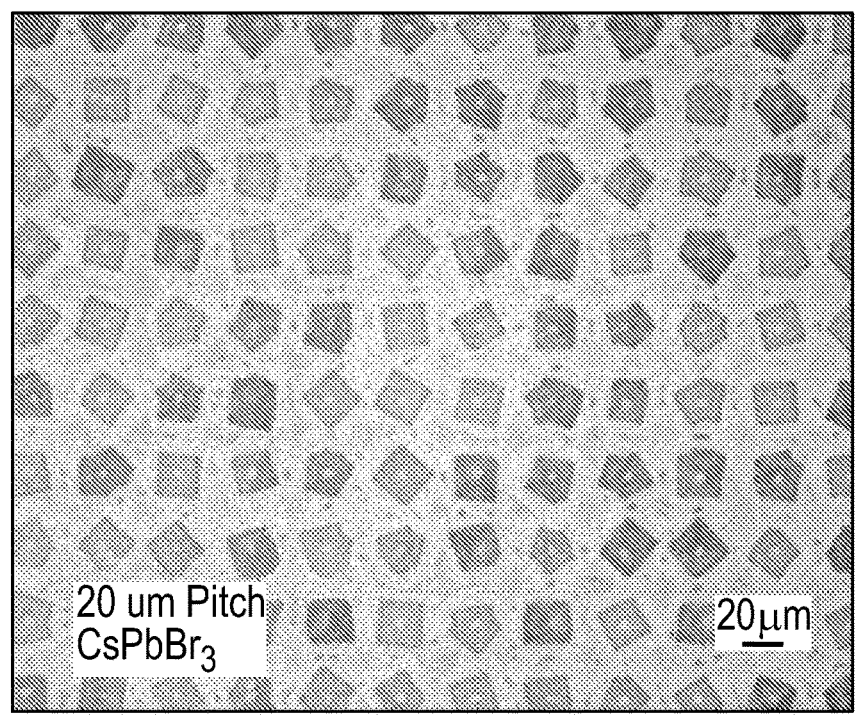
FIG. 7D shows a microscopic optical image of a CsPbBr$_3$ sample according to an embodiment of the present disclosure.

FIG. 7D shows a microscopic optical image of the CsPbBr$_3$ sample on a substrate having a 20 μm pitch size, as described above.

Figure 8:
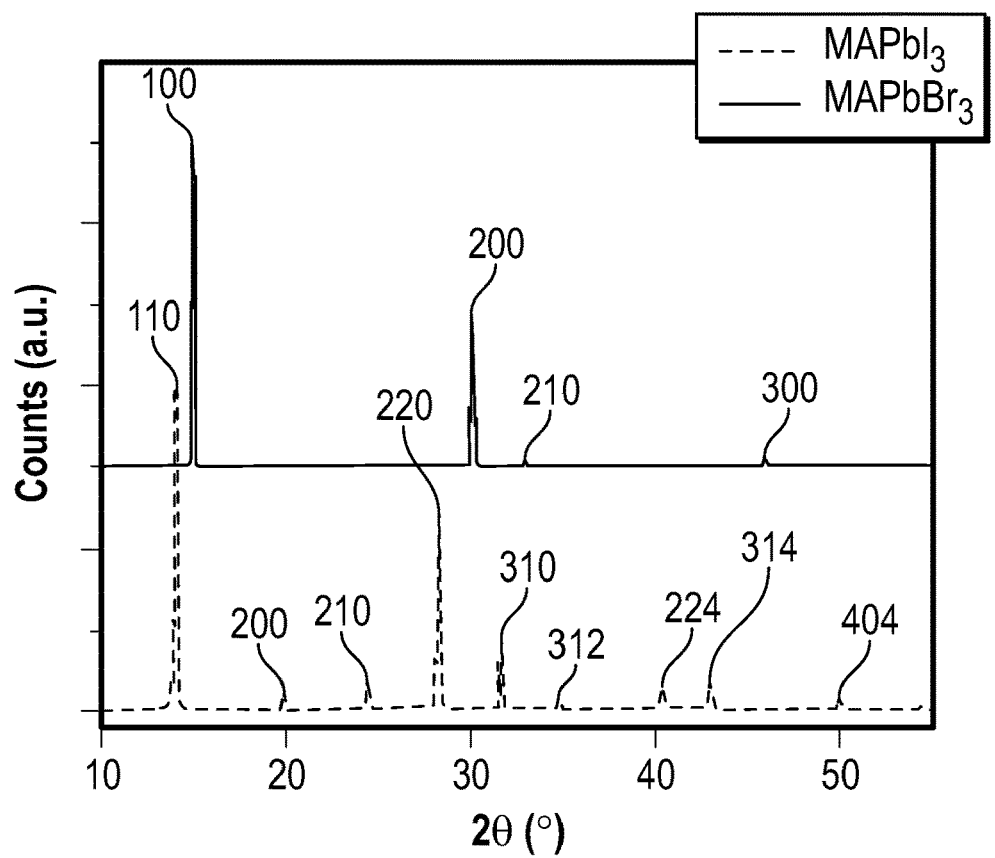
FIG. 8 shows the X-ray diffraction (XRD) results of a MAPbI$_3$ and a MAPbBr$_3$ film according to embodiments of the present disclosure.

The MAPbI$_3$ film on a 100 μm-pitch substrate prepared in Example 2 above and the MAPbBr$_3$ film on a 50 μm-pitch substrate prepared in Example 3 above (shown in FIGS. 7C-7F) were characterized using X-ray diffraction (XRD), and the results are shown in FIG. 8. The XRD peaks were indexed and were found to match those in literature for both films, corresponding to the cubic phase for MAPbBr$_3$ crystals and the tetragonal phase for MAPbI$_3$ crystals. It should be noted the MAPbBr$_3$ exhibited intense signals in the <100> crystalline directions and much weaker signals in other crystallographic directions, suggesting the grown crystals had a preferred orientation along <100>. However, the MAPbI$_3$ film did not show a preferred growth orientation. Such a difference could be caused by a higher structural symmetry in the cubic phase MAPbBr$_3$ compared to the tetragonal phase MAPbI$_3$.

Example 5—Environmental Stability

The environmental stability of the halide perovskite films was qualitatively evaluated by exposing them to ambient air without any encapsulation. Within the test period of this work, the relative humidity of the ambient varied from 40% to 80%. After one week exposure in air, the nano-crystal MAPbI$_3$ sample on an ITO/glass substrate had completely turned yellow in color, indicating the degradation of MAPbI$_3$ into PbI$_2$ after accumulative reactions with moisture in air. The film with large-crystal MAPbI$_3$ (100 μm grain size) still appeared black after three-month exposure in air, proving the robustness of the large-crystal film to ambient moisture attack.

Figure 9A:
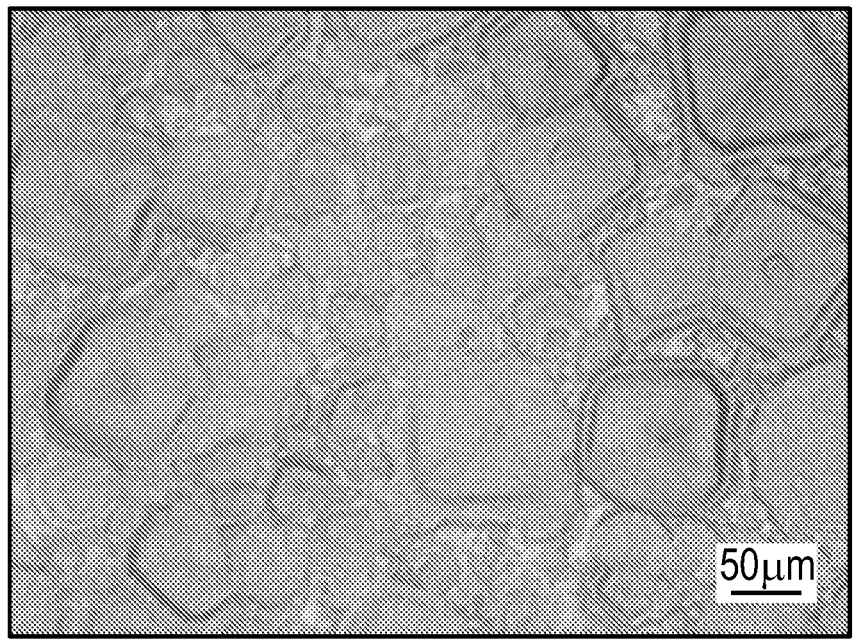
FIG. 9A shows a microscopic optical image of a MAPbBr$_3$ film on an ITO/glass substrate.
Figure 9B:
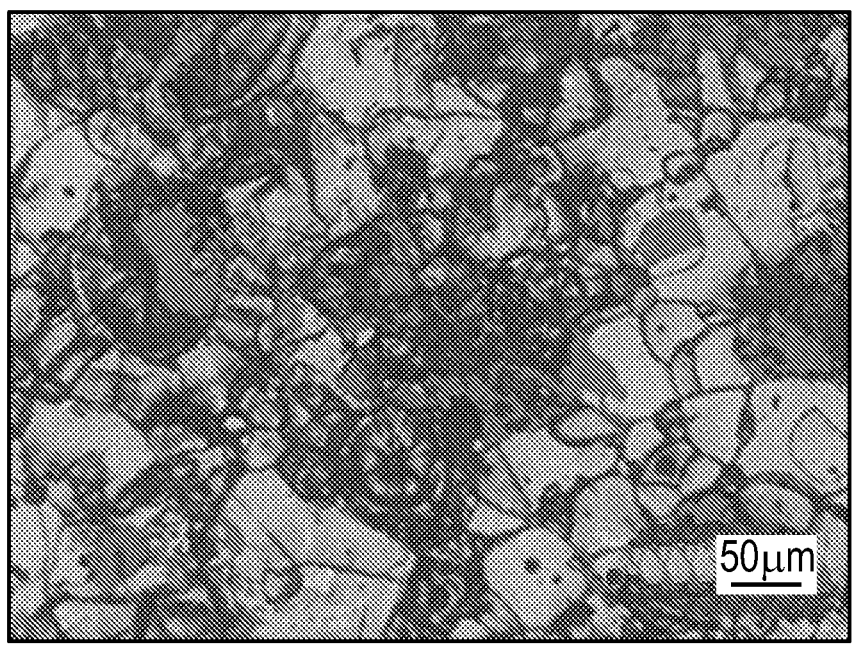
FIG. 9B shows a microscopic optical image of the film of FIG. 9A after three-month air exposure.
Figure 9C:
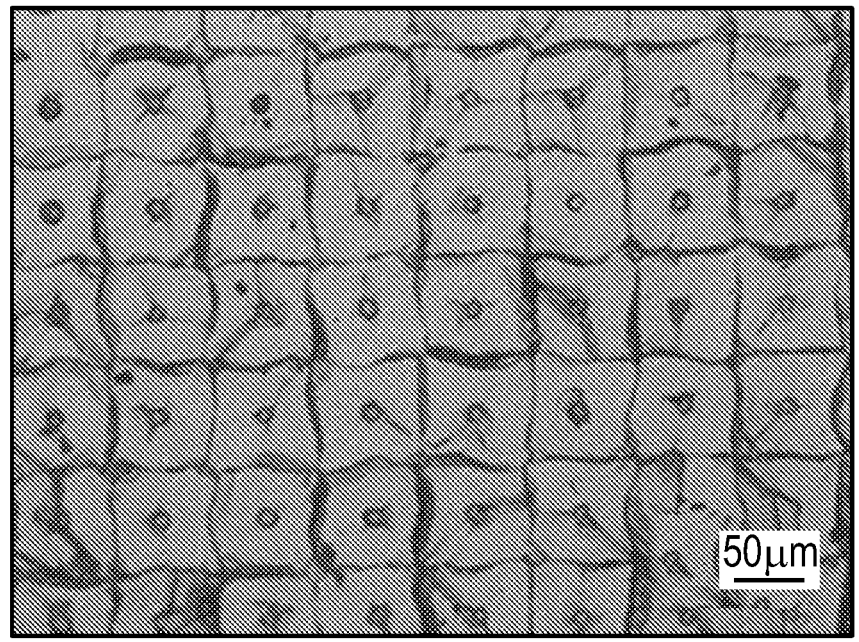
FIG. 9C shows a microscopic optical image of a large-crystal film on a patterned Au/ITO/glass substrate (50 μm pitch size) according to an embodiment of the present disclosure after three-month air exposure.

Moisture resistance of the MAPbBr$_3$ films was also tested. FIGS. 9A and 10B show the microscopic optical images of an as-prepared film as disclosed in Example 1 on an ITO/glass substrate (no Au pattern) and the same film after three-month air exposure, respectively. The pristine film consisted of large and small grains. After three months, severe morphological changes and film discontinuity occurred in the regions with small grains. However, the large-crystal film on a patterned Au/ITO/glass substrate (50 μm pitch size) experienced little changes of morphology after the three-month air exposure, as shown in the microscopic optical image of FIG. 9C.

Figure 9D:
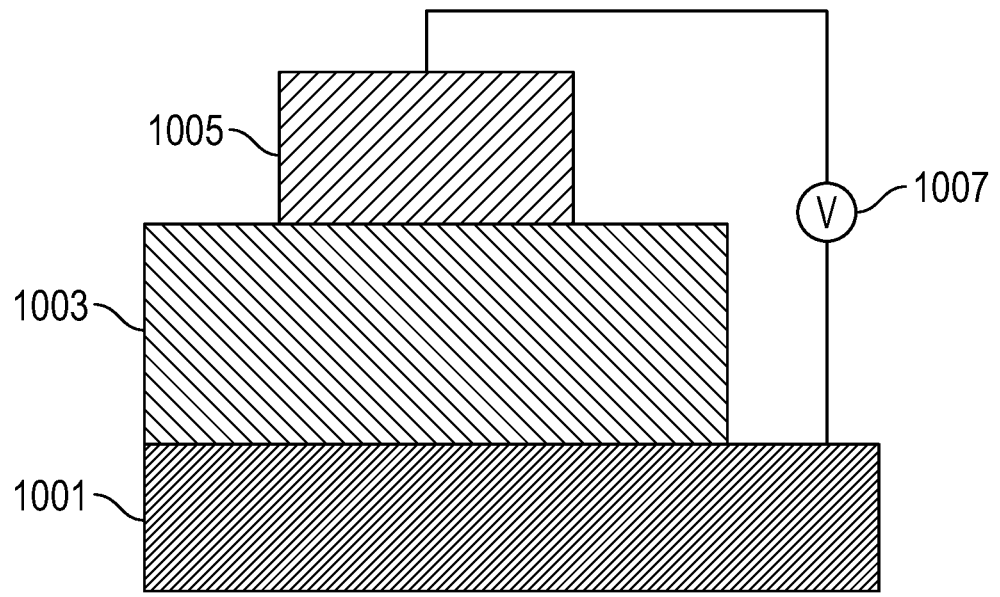
FIG. 9D shows a schematic illustration of an LED including the large-crystal film of FIG. 9B.

Next, LEDs were fabricated and characterized with the large-crystal MAPbBr$_3$ film after three-month air exposure described above. The device structure is schematically illustrated in FIG. 9D. As shown in FIG. 9D, the LED consisted of an ITO bottom electrode 1001, an light-emitting layer 1003 with the large-crystal MAPbBr$_3$ film described above, a top electrode 1005 composed of indium gallium eutectic (In/Ga), and a voltage source 1007.

Figure 9E:
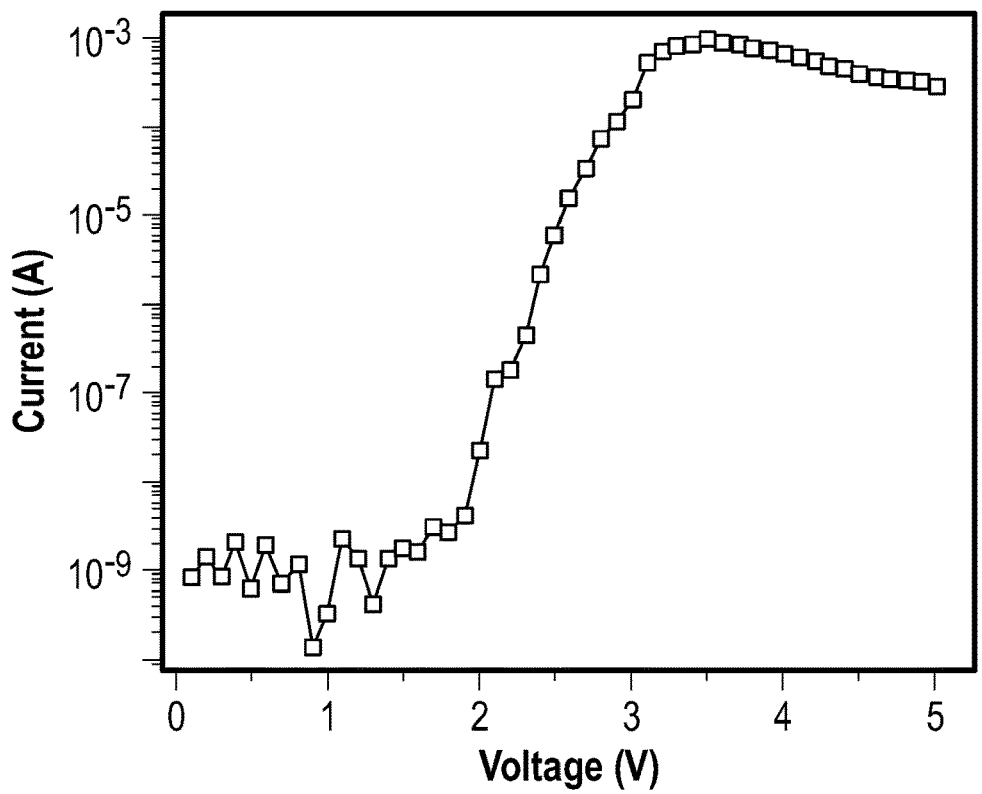
FIG. 9E shows the device current recorded as various voltages were applied to the device of FIG. 9D.
Figure 9F:
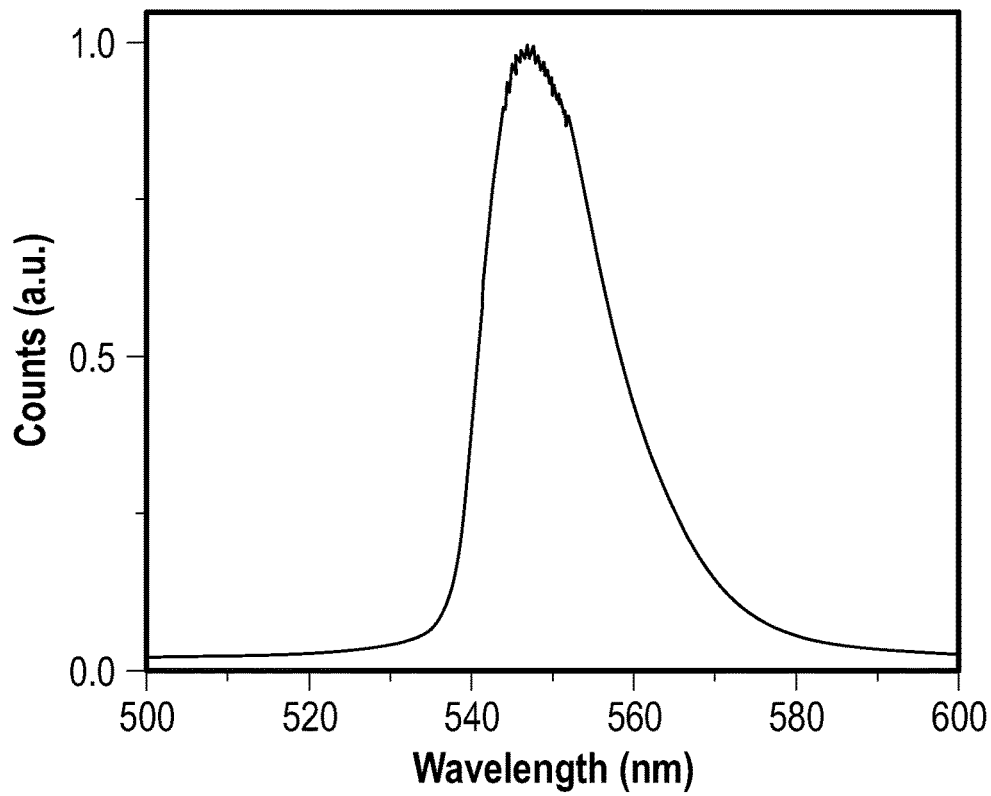
FIG. 9F shows the electroluminescence spectrum of the device of FIG. 9D.

The applied voltage was swept from 0 to 5 V and the device current was recorded as seen in FIG. 9E. The current had a swift increase after 1.9 V and obtained a maximum of ~0.9 mA at 3.5 V. Intense light emission was both observed from the top through the edge of the In/Ga electrode and from the bottom through the ITO/glass substrate. The electroluminescence spectrum of this LED device was collected as shown in FIG. 9F. The spectrum peaked at 547 nm with a full width at half maximum of ~18 nm. The low operation voltage and high spectrum quality are both comparable with the best reported perovskite LEDs in literature. Further, the decent LED performance shown in these figures from the long-term air exposed MAPbBr$_3$ films further evidences the environmental stability of these films.

We claim:

1. A method of making a halide perovskite thin film comprising:
   a) forming a pattern of islands of a nucleation promoter material directly onto a substrate;
   b) applying onto the substrate and islands a solution which comprises a halide perovskite or precursors thereof, to form a coated substrate; and
   c) drying the coated substrate to form a crystalline halide perovskite thin film,
   wherein the applying and drying of the coated substrate are carried out in a manner effective to cause halide perovskite crystals to nucleate on the islands of the nucleation promoter material and grow such that neighboring crystals meet and merge into a continuous film.

2. The method of claim 1, wherein the substrate comprises silicon oxide glass or indium tin oxide glass.

3. The method of claim 1, wherein each of the islands has a diameter of from about 1 μm to about 10 μm.

4. The method of claim 1, wherein the pattern of islands is a grid pattern.

5. The method of claim 1, wherein the pattern of islands has a pitch size of from about 10 μm to about 100 μm.

6. The method of claim 1, wherein the pattern of islands has a pitch size, and wherein the crystalline halide perovskite thin film comprises halide perovskite crystals having a diameter of about the pitch size of the pattern of islands.

7. The method of claim 1, wherein the nucleation promoter material comprises a metal or a metal oxide.

8. The method of claim 1, wherein the nucleation promoter material is gold.

9. The method of claim 1, wherein the crystalline halide perovskite thin film comprises halide perovskite crystals having a diameter or largest dimension of from about 10 μm to about 100 μm.

10. The method of claim 1, wherein the halide perovskite crystals have a height or thickness from about 600 nm to about 700 nm.

11. The method of claim 1, wherein the halide perovskite comprises MAPbBr$_3$, MAPbI$_3$, or CsPbBr$_3$.

12. A halide perovskite thin film structure comprising:
   a substrate;
   a pattern of islands of a nucleation promoter material disposed directly on the substrate; and
   halide perovskite crystals disposed on the substrate and the islands, the halide perovskite crystals being contiguously disposed in the form of a film,
   wherein the halide perovskite crystals are characterized by periodical grains emanating from each of the islands of nucleation promoter material.

13. The thin film of claim 12, wherein the substrate comprises silicon oxide glass, indium tin oxide glass, or another suitable glass.

14. The thin film of claim 12, wherein each of the islands has a diameter of from about 1 μm to about 10 μm.

15. The thin film of claim 12, wherein the nucleation promoter material comprises a metal or a metal oxide.

16. The thin film of claim 12, wherein the nucleation promoter material is gold.

17. The thin film of claim 12, wherein the pattern of islands has a pitch size, and wherein the crystalline halide perovskite thin film comprises halide perovskite crystals having a diameter of about the pitch size of the pattern of islands.

18. The thin film of claim 12, wherein the crystalline halide perovskite thin film comprises halide perovskite crystals having a diameter or largest dimension of from about 10 μm to about 100 μm.

19. The thin film of claim 12, wherein the halide perovskite crystals have a thickness or height from about 600 nm to about 700 nm.

20. The thin film of claim 12, wherein the halide perovskite comprises $MAPbBr_3$, $MAPbI_3$, or $CsPbBr_3$.

21. An LED comprising:
an ITO bottom electrode;
a light-emitting layer comprising the thin film structure of claim 12; and
a top electrode.

22. The LED of claim 21, wherein the top electrode comprises indium gallium eutectic.

23. The LED of claim 21, wherein the halide perovskite comprises $MAPbBr_3$, $MAPbI_3$, or $CsPbBr_3$.

* * * * *